(12) United States Patent
Kim

(10) Patent No.: US 12,185,466 B2
(45) Date of Patent: Dec. 31, 2024

(54) ELECTRICAL CONNECTION STRUCTURE AND ELECTRONIC DEVICE INCLUDING THE SAME

(71) Applicant: SAMSUNG ELECTRONICS CO., LTD., Suwon-si (KR)

(72) Inventor: Gidae Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 122 days.

(21) Appl. No.: 18/083,033

(22) Filed: Dec. 16, 2022

(65) Prior Publication Data

US 2023/0141357 A1    May 11, 2023

Related U.S. Application Data

(63) Continuation of application No. PCT/KR2022/016727, filed on Oct. 28, 2022.

(30) Foreign Application Priority Data

Nov. 8, 2021  (KR) .......................... 10-2021-0152020
Dec. 27, 2021  (KR) .......................... 10-2021-0188906

(51) Int. Cl.
  *H05K 1/14*    (2006.01)
  *H05K 1/18*    (2006.01)

(52) U.S. Cl.
  CPC ............. *H05K 1/145* (2013.01); *H05K 1/181* (2013.01); *H05K 2201/10325* (2013.01)

(58) Field of Classification Search
  None
  See application file for complete search history.

(56) References Cited

U.S. PATENT DOCUMENTS 7,294,019 B1   11/2007  Jeon
11,019,736 B2   5/2021  Woo et al.
(Continued)

FOREIGN PATENT DOCUMENTS

CN    107819221 A    3/2018
EP    3 982 482 A1   4/2022
(Continued)

OTHER PUBLICATIONS

International Search Report (PCT/ISA/210) issued Feb. 7, 2023 by the International Searching Authority in International Patent Application No. PCT/KR2022/016727.
(Continued)

*Primary Examiner* — Krystal Robinson
(74) *Attorney, Agent, or Firm* — Sughrue Mion, PLLC

(57) ABSTRACT

An electronic device includes a first printed circuit board; a second printed circuit board spaced apart from the first printed circuit board; a connection member electrically connecting the first printed circuit board and the second printed circuit board, the connection member including a first connection part connected to the first printed circuit board and a second connection part connected to the second printed circuit board; and a first intermediate member including: a first connector provided on a first surface of the first intermediate member facing the first printed circuit board and electrically connected to the first printed circuit board; and a second connector provided on a second surface of the first intermediate member opposite to the first surface and electrically connected to the connection member and the first connector, wherein the first connector and the second connector are separated from each other in a first direction.

20 Claims, 16 Drawing Sheets

(56) References Cited

U.S. PATENT DOCUMENTS

| | | | |
|---|---|---|---|
| 11,546,454 B2 | 1/2023 | Hong | |
| 11,775,015 B2 * | 10/2023 | Lee | G06F 1/1683 |
| | | | 361/679.27 |
| 2012/0295666 A1 | 11/2012 | Sakurai et al. | |
| 2017/0290184 A1 | 10/2017 | Kim et al. | |
| 2018/0076549 A1 | 3/2018 | Chen | |
| 2019/0387649 A1 * | 12/2019 | Hong | H04M 1/0277 |
| 2020/0127404 A1 | 4/2020 | Seo et al. | |
| 2020/0254721 A1 * | 8/2020 | Lee | B32B 19/04 |
| 2020/0280807 A1 * | 9/2020 | Kim | H04R 1/028 |
| 2021/0084773 A1 | 3/2021 | Leng et al. | |
| 2021/0136916 A1 | 5/2021 | Kim et al. | |
| 2021/0384662 A1 | 12/2021 | Lee et al. | |
| 2023/0141357 A1 | 5/2023 | Kim | |

FOREIGN PATENT DOCUMENTS

| | | |
|---|---|---|
| JP | 2007-201918 A | 8/2007 |
| KR | 10-2010-0135054 A | 12/2010 |
| KR | 10-2014-0067339 A | 6/2014 |
| KR | 10-2014-0115881 A | 10/2014 |
| KR | 10-2017-0051588 A | 5/2017 |
| KR | 10-2017-0112761 A | 10/2017 |
| KR | 10-2020-0030768 A | 3/2020 |
| KR | 10-2020-0045661 A | 5/2020 |
| KR | 10-2020-0048135 A | 5/2020 |
| KR | 10-2020-0140544 A | 12/2020 |
| KR | 10-2021-0031303 A | 3/2021 |
| KR | 10-2021-0100391 A | 8/2021 |
| WO | 2011/121957 A1 | 10/2011 |
| WO | 2021/221347 A1 | 11/2021 |
| WO | 2023/080565 A1 | 5/2023 |

OTHER PUBLICATIONS

Written Opinion (PCT/ISA/237) issued Feb. 7, 2023 by the International Searching Authority in International Patent Application No. PCT/KR2022/016727.

Communication issued Oct. 24, 2024 by the European Patent Office for European Patent Application No. 22890296.1.

* cited by examiner

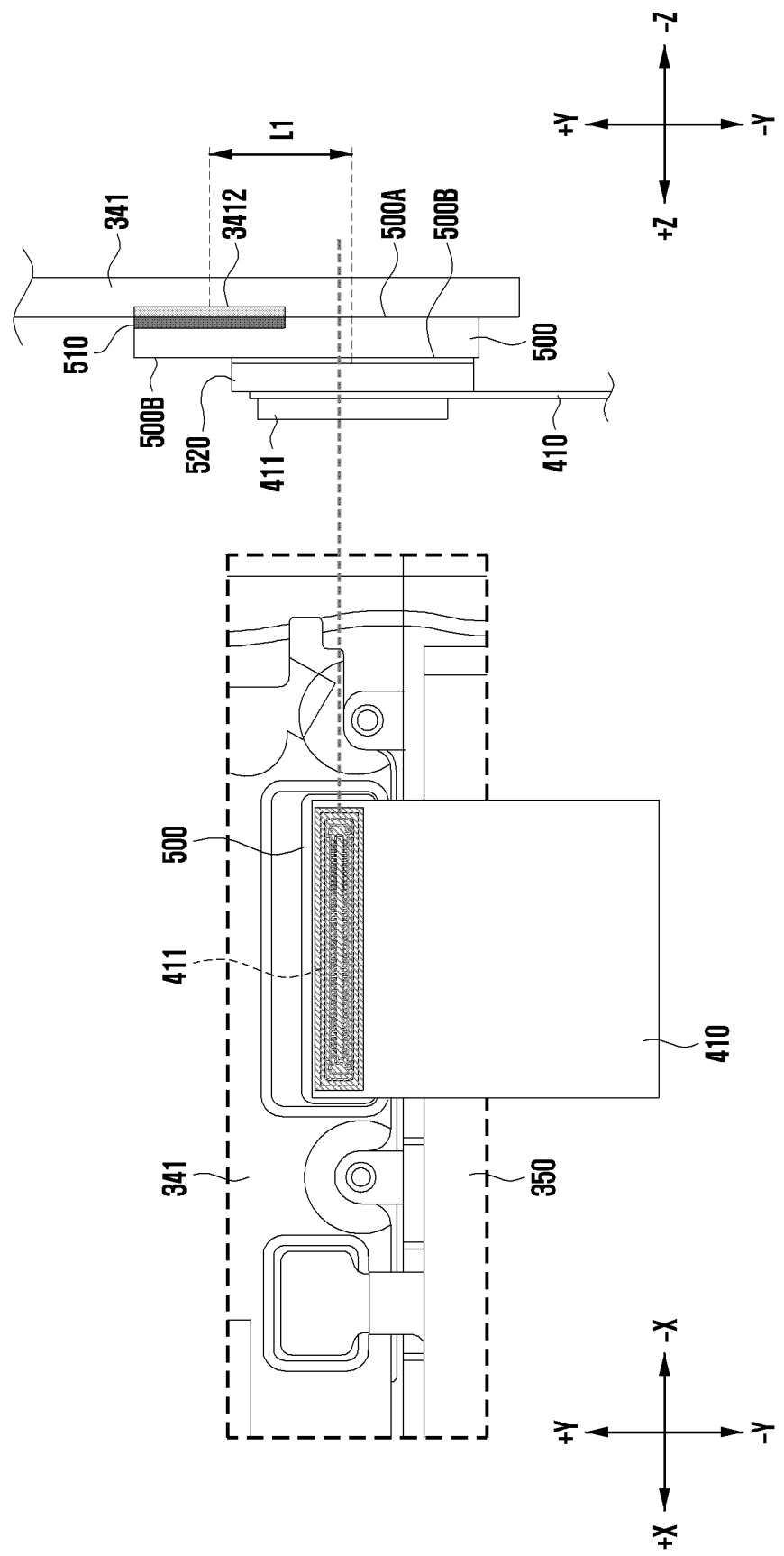

ELECTRICAL CONNECTION STRUCTURE AND ELECTRONIC DEVICE INCLUDING THE SAME

CROSS-REFERENCE TO RELATED APPLICATIONS

This application is a continuation application of International Application No. PCT/KR2022/016727, filed on Oct. 28, 2022, which claims priority to Korean Patent Application 10-2021-0152020, filed on Nov. 8, 2021, and Korean Patent Application 10-2021-0188906, filed on Dec. 27, 2021, in the Korean Intellectual Property Office, the disclosures of which are incorporated by reference herein in their entireties.

BACKGROUND

1. Field

The disclosure relates to an electrical connection structure for an electronic device and to the electronic device including the electrical connection structure.

2. Description of Related Art

Various electronic components included in an electronic device may be electrically connected to a substrate and thus interconnected through the substrate. For example, such electronic components may be electrically connected to a printed circuit board (PCB) on which circuit wiring is printed.

The electronic device may include printed circuit boards disposed at different positions. In some cases, electrical connections between printed circuit boards disposed at different positions may be required.

A variety of electronic devices have been released to satisfy the needs of consumers. In order to lower the manufacturing cost of the electronic devices, manufacturers are improving the compatibility of electronic components. Improvement in the compatibility of electronic components allows the same electronic components to be used for various electronic devices, thereby enhancing productivity, lowering production costs, and increasing market competitiveness.

Depending on design matters, various electronic devices may have different areas of an internal space, in which electronic components are disposed, and have different arrangements between the electronic components.

The electronic components included in the electronic device may be disposed on a printed circuit board. In some cases, the electronic device may include a plurality of printed circuit boards disposed at different positions. Also, the electronic device may include a connection structure for electrically connecting the plurality of printed circuit boards.

Various embodiments of the disclosure provide a connection structure capable of corresponding to various types of electronic devices.

SUMMARY

According to an aspect of the disclosure, an electronic device includes: a first printed circuit board; a second printed circuit board spaced apart from the first printed circuit board; a connection member electrically connecting the first printed circuit board and the second printed circuit board, the connection member including a first connection part connected to the first printed circuit board and a second connection part connected to the second printed circuit board; and a first intermediate member including: a first connector provided on a first surface of the first intermediate member facing the first printed circuit board and electrically connected to the first printed circuit board; and a second connector provided on a second surface of the first intermediate member opposite to the first surface and electrically connected to the connection member and the first connector, wherein the first connector and the second connector are separated from each other in a first direction.

The electronic device may further include a battery provided between the first printed circuit board and the second printed circuit board, wherein the connection member extends to overlap at least a portion of the battery.

A first separation distance in the first direction between the battery and the first connector may be different from a second separation distance in the first direction between the battery and the second connector.

The first intermediate member may have a thickness configured to reduce a step difference between the battery and the first printed circuit board, and to reduce a deformation of the connection member passing by the battery and connected to the second connector of the first intermediate member.

The first connector may include a connecting pad contacting a board pad formed on the first printed circuit board, and the second connector may include a socket into which the first connection part of the connection member is inserted.

The connecting pad may include a plurality of pads connected to a plurality of first pins included in the socket of the second connector, the plurality of pads may include power pads provided on both sides of the first connector and having width larger than widths of remaining pads of the plurality of pads, and the power pads are connected to power pins for transmitting power among a plurality of second pins included in the connection member.

The connecting pad may include: a first pad connected to a first electronic component of the electronic device; a second pad connected to a second electronic component of the electronic device; and a ground pad provided between the first pad and the second pad and connected to a ground.

The first connector and the second connector may be electrically connected through a via-hole formed in the first intermediate member.

The electronic device may further include a second intermediate member including: a third connector provided on a third surface of the second intermediate member facing the second printed circuit board and electrically connected to the second printed circuit board; and a fourth connector provided on a fourth surface of the second intermediate member opposite to the third surface and electrically connected to the connection member and the third connector.

The electronic device may further include a display module, and the connection member electrically may connect the display module and the first printed circuit board.

The electronic device may further include a cover housing covering at least a portion of the connection member and a portion of the second printed circuit board, and a portion of the second connection part of the connection member may be inserted into a hole formed in the cover housing.

According to an aspect of the disclosure a connection structure of a printed circuit board, includes: a connection member including a connection part connected to the printed circuit board; and an intermediate member including a first connector provided on a first surface of the intermediate member facing the printed circuit board and electrically connected to the printed circuit board, and a second connector provided on a second surface of the intermediate member opposite to the first surface and electrically connected to the connection member and the first connector, wherein the first connector and the second connector are separated from each other in a first direction.

The printed circuit board may be adjacent to at least one of electronic components including a battery.

A first separation distance in the first direction between the at least one of the electronic components and the first connector may be different from a second separation distance in the first direction between the at least one of the electronic components and the second connector.

The intermediate member may have a thickness configured to reduce a step difference between the at least one of the electronic components and the printed circuit board, and to reduce a deformation of the connection member adjacent to the at least one of the electronic components and connected to the second connector of the intermediate member.

The first connector may include a connecting pad contacting a board pad formed on the printed circuit board, and the second connector of the intermediate member may include a socket configured to allow a first connection part of the connection member to be inserted therein.

The connecting pad may include a plurality of pads respectively connected to a plurality of first pins included in the socket of the second connector, the plurality of pads may include power pads provided on both sides of the first connector and having a width larger than widths of remaining pads of the plurality of pads, and the power pads of the plurality of pads are connected to power pins for transmitting power among a second plurality of pins included in the connection member.

The connecting pad may include: a first pad configured to be connected to a first electronic component; a second pad configured to be connected to a second electronic component; and a ground pad provided between the first pad and the second pad and configured to be connected to a ground.

The first connector and the second connector of the intermediate member may be electrically connected through a via-hole formed in the intermediate member.

The connection member may electrically connect a display module and the printed circuit board.

According to various embodiments of the disclosure, a compatibility of a same electronic component may be improved, such that the same electronic component may be used in various electronic devices. As a result, the productivity of the electronic device may be increased, and/or a production cost of the electronic device may be reduced.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 6A and 6B are diagram illustrating a state in which a connection point of a connection member is changed by an intermediate member, according to various embodiments of the disclosure;

DETAILED DESCRIPTION

Figure 1:
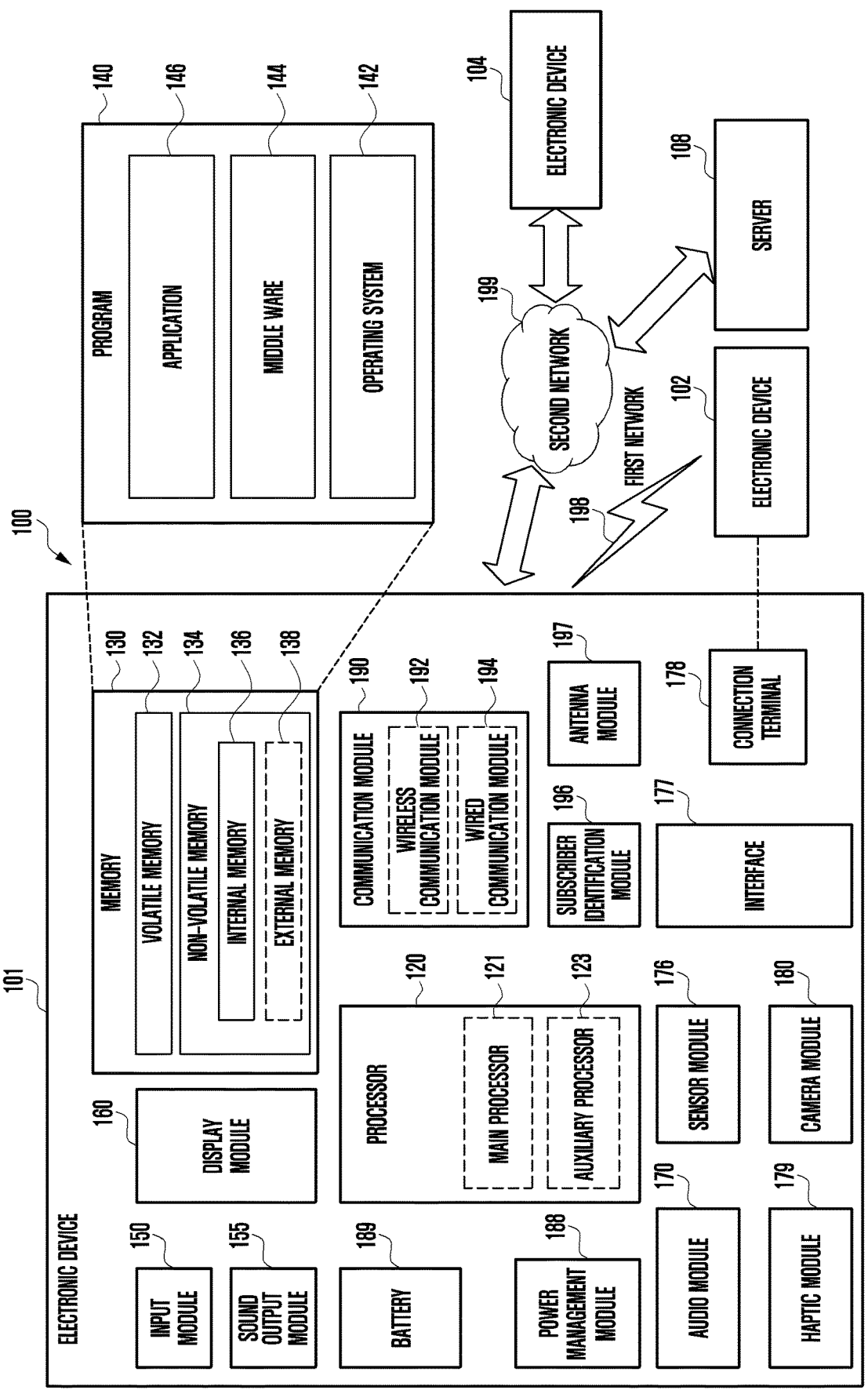
FIG. 1 is a block diagram illustrating an electronic device in a network environment, according to various embodiments of the disclosure.

The various embodiments described below and the terms used herein are not intended to limit the technological features set forth herein to particular embodiments and include various changes, equivalents, or replacements for a corresponding embodiment.

With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
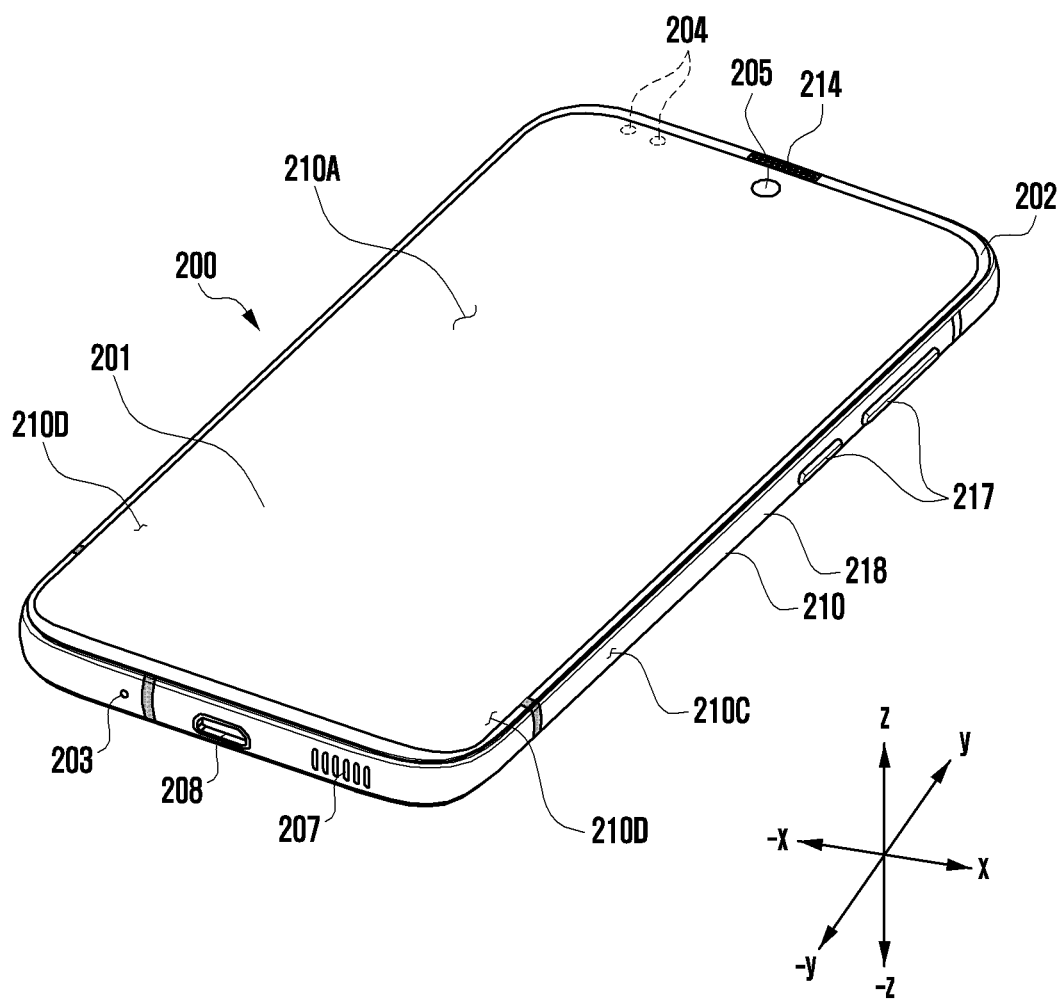
FIG. 2A is a perspective diagram illustrating a front surface of an electronic device, according to various embodiments of the disclosure.
Figure 2B:
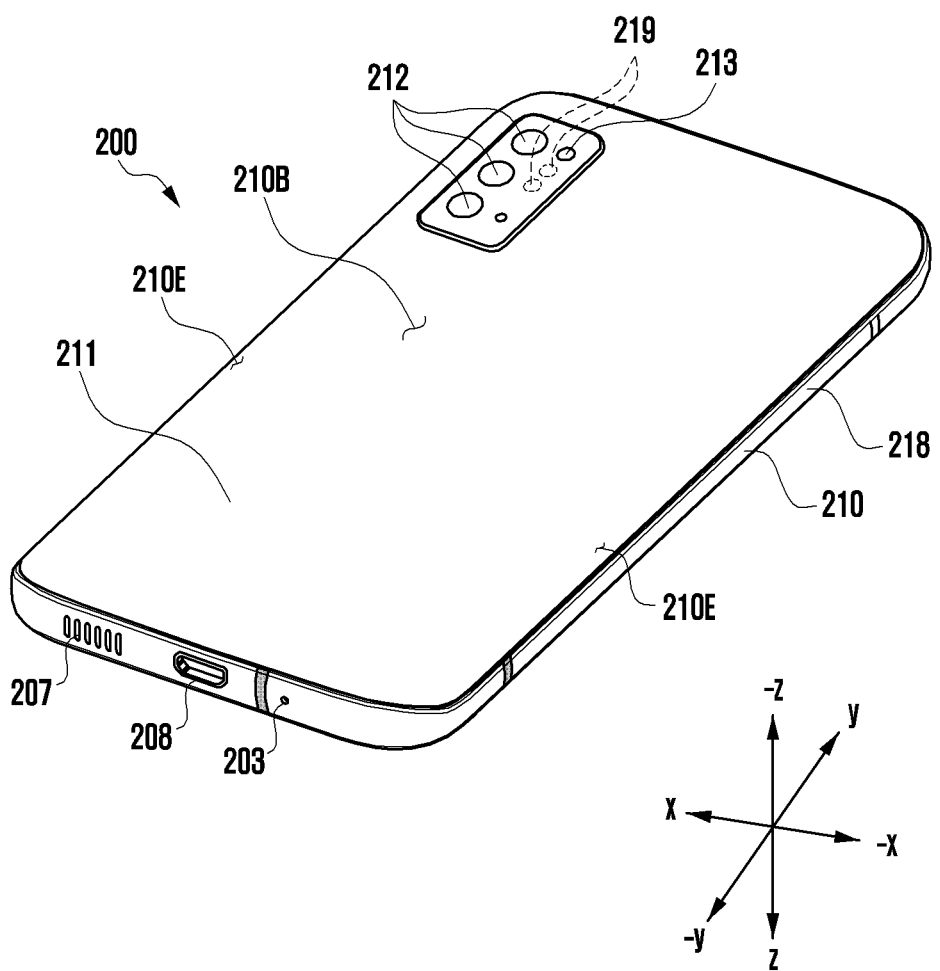
FIG. 2B is a perspective diagram illustrating a rear surface of the electronic device shown in FIG. 2B, according to various embodiments of the disclosure.

FIG. 2A is a front perspective view of an electronic device, according to various embodiments of the disclosure. FIG. 2B is a rear perspective view of the electronic device of FIG. 2A, according to various embodiments of the disclosure.

The electronic device 200 to be described below may include at least one of the components of the electronic device 101 described above with reference to FIG. 1.

With reference to FIG. 2A and FIG. 2B, the electronic device 200, according to an embodiment, may include a housing 210 that includes a first surface (or front surface) 210A, a second surface (or rear surface) 210B, and a side surface 210C surrounding a space between the first surface 210A and the second surface 210B. In another embodiment (not shown), the housing 210 may refer to a structure forming a part of the first surface 210A, the second surface 210B, and the side surface 210C in FIG. 2A. According to an embodiment, the first surface 210A may be formed by a front plate 202 (e.g., glass plate or polymer plate including various coating layers) whose at least a portion is substantially transparent. The second surface 210B may be formed by a rear plate 211 that is substantially opaque. The rear plate 211 may be formed by, for example, coated or tinted glass, ceramic, polymer, metal (e.g., aluminum, stainless steel (STS), or magnesium), or a combination of at least two thereof. The side surface 210C may be formed by a side bezel structure (or "side member") 218 coupled to the front plate 202 and the rear plate 211 and including a metal and/or a polymer. In an embodiment, the rear plate 211 and side bezel structure 218 may be integrally formed and include the same material (e.g., metal material such as aluminum).

As shown in FIG. 2A, the front plate 202 may include a first region 210D that is curved and seamlessly extended from the first surface 210A toward the rear plate at opposite ends of the longer edge of the front plate 202. As shown in FIG. 2B, the rear plate 211 may include a second region 210E that is curved and seamlessly extended from the second surface 210B toward the front plate 202 respectively at opposite ends of the longer edge. In an embodiment, the front plate 202 or the rear plate 211 may include only one of the first region 210D and the second region 210E. In an embodiment, the front plate 202 may not include the first region and the second region, but may include only a flat surface disposed parallel to the second surface 210B. In the above embodiments, when the electronic device is viewed from the side thereof, the side bezel structure 218 may have a first thickness (or width) on a side where the first region 210D or the second region 210E is not included, and may have a second thickness thinner (e.g., less) than the first thickness on a side where the first region 210D or the second region 210E is included.

According to an embodiment, the electronic device 200 may include at least one or more of display 201, input device 203, sound output devices 207 and 214, sensor modules 204 and 219, camera modules 205 and 212, key input device 217, indicator (not shown), or connector 208. In an embodiment, at least one of the elements (e.g., key input device 217 or indicator) may be omitted from the electronic device 200, or another element may be added to the electronic device 200.

The display 201 may be exposed, for example, through a significant portion of the front plate 202. In an embodiment, at least a portion of the display 201 may be exposed through the front plate 202 forming the first surface 210A and the first region 210D of the side surface 210C. The display 201 may be coupled to or disposed adjacent to a touch sensing circuit, a pressure sensor capable of measuring the intensity (pressure) of a touch, and/or a digitizer that detects a magnetic field type stylus pen. In an embodiment, at least some of the sensor modules 204 and 219, and/or at least some of the key input devices 217 may be disposed on the first region 210D and/or the second region 210E.

The input device 203 may include a microphone 203. In an embodiment, the input device 203 may include a plurality of microphones 203 arranged to detect the direction of a sound. The sound output devices 207 and 214 may include speakers 207 and 214. The speakers 207 and 214 may include an external speaker 207 and a call receiver 214. In an embodiment, the microphone 203, the speakers 207 and 214, and the connector 208 may be at least partially disposed in the internal space of the electronic device 200, and may be exposed to the external environment through at least one hole formed in the housing 210. In an embodiment, the hole formed in the housing 210 may be commonly used for the microphone 203 and the speakers 207 and 214. In an embodiment, the sound output devices 207 and 214 may include a speaker (e.g., a piezo speaker) that operates in isolation from the hole formed in the housing 210.

The sensor modules 204 and 219 may generate an electrical signal or a data value corresponding to an internal operating state of the electronic device 200 or an external environmental state. The sensor modules 204 and 219 may include, for example, a first sensor module 204 (e.g., proximity sensor) and/or a second sensor module (not shown) (e.g., fingerprint sensor) disposed on the first surface 210A of the housing 210, and/or a third sensor module 219 (e.g., a heart rate monitor (HRM) sensor) disposed on the second surface 210B of the housing 210. The fingerprint sensor may be disposed on the first surface 210A (e.g., home key button) of the housing 210, on a portion of the second surface 210B, and/or under the display 201. The electronic device 200 may further include a sensor module which is not shown, for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, a proximity sensor, or an illuminance sensor.

The camera modules 205 and 212 may include a first camera module 205 disposed on the first surface 210A of the electronic device 200, a second camera module 212 disposed on the second surface 210B, and/or a flash 213. The camera modules 205 and 212 may include one or more lenses, an image sensor, and/or an image signal processor. The flash 213 may include, for example, a light emitting diode or a xenon lamp. In an embodiment, two or more lenses (e.g., wide-angle lens, ultra-wide-angle lens, or telephoto lens) and image sensors may be arranged in one surface of the electronic device 200.

The key input devices 217 may be arranged in the side surface 210C of the housing 210. In another embodiment, the electronic device 200 may not include some or all of the above-mentioned key input devices 217, and a key input device 217 not included may be implemented on the display 201 in a different form such as a soft key. In another embodiment, the key input devices 217 may be implemented using a pressure sensor included in the display 201.

The indicator may be disposed on, for example, the first surface 210A of the housing 210. The indicator may provide, for example, state information of the electronic device 200 in a light form (e.g., light emitting element). In another embodiment, the light emitting element may provide a light source interacting with, for example, the operation of the camera module 205. The indicator may include, for example, a light emitting diode (LED), an IR LED, and/or a xenon lamp.

The connector holes 208 may include a first connector hole 208 capable of accepting a connector (e.g., universal serial bus (USB) connector) for transmitting and receiving power and/or data to and from an external electronic device, and/or a second connector hole (e.g., earphone jack) (not shown) capable of accepting a connector for transmitting and receiving an audio signal to and from an external electronic device.

Some of the camera modules 205 and 212, some of the sensor modules 204 and 219, or the indicator may be disposed to be exposed through the display 201. For example, the camera module 205, the sensor module 204, or the indicator may be arranged in the internal space of the electronic device 200 so as to be in contact with the external environment through an opening of the display 201 perforated up to the front plate 202 or a transmissive region. According to an embodiment, the region in which the display 201 and the camera module 205 face each other may be formed as a transmissive region having a preset transmittance as a part of the content display area. According to an embodiment, the transmissive region may be formed to have a transmittance in a range of about 5 percent to about 20 percent. This transmissive region may include a region overlapping an effective area (e.g., angle-of-view area) of the camera module 205 through which light passes for image generation with an image formed by an image sensor. For example, the transmissive region of the display 201 may include a region having a lower pixel density than surrounding regions. For example, the transmissive region may replace the opening. For example, the camera module 205 may include an under display camera (UDC). In another embodiment, a certain sensor module 204 may be disposed in the internal space of the electronic device so as to perform its function without being visually exposed through the front plate 202. For example, in this case, the region of the display 201 facing the sensor module may not need a perforated opening.

Figure 3:
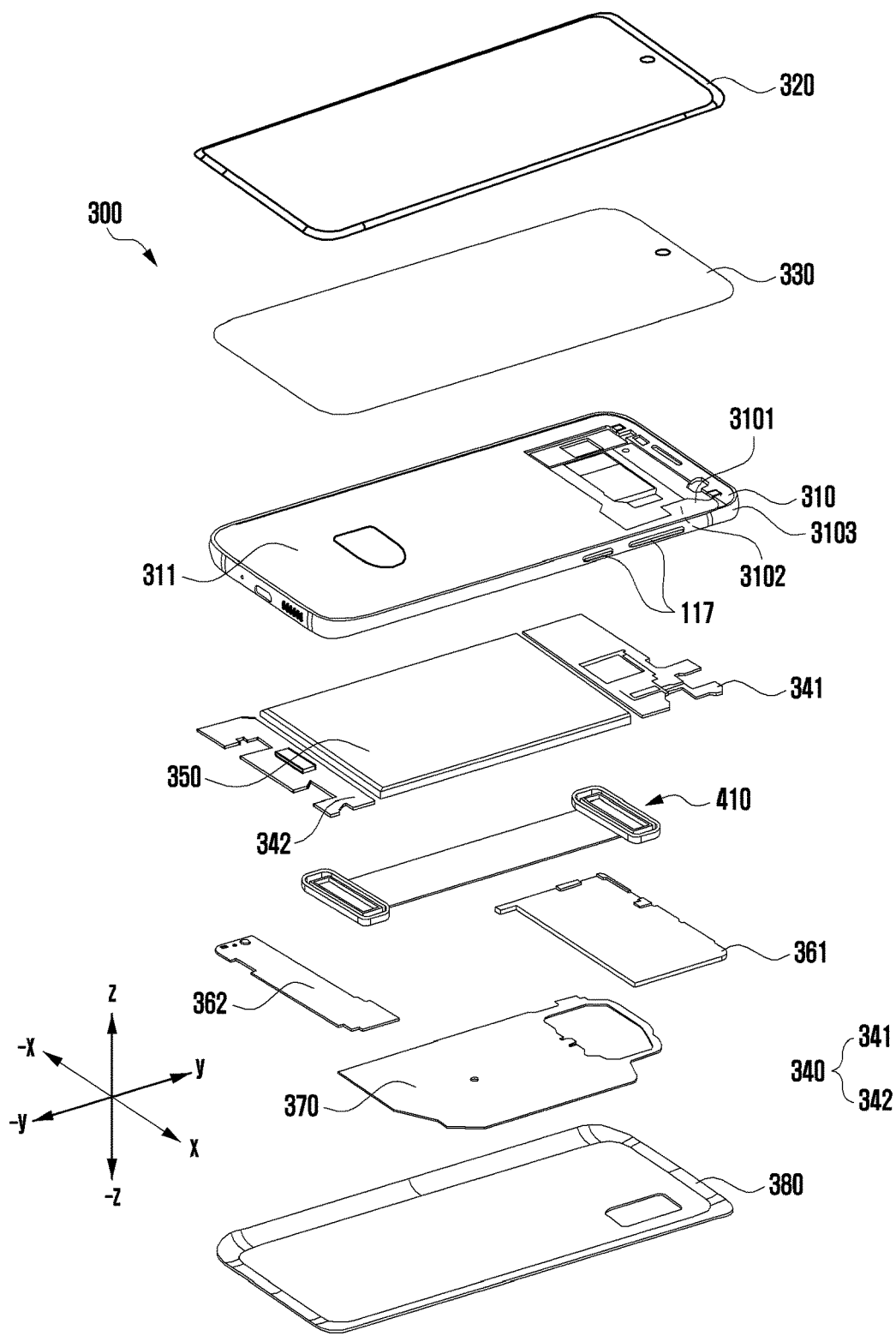
FIG. 3 is an exploded perspective diagram illustrating an electronic device, according to various embodiments of the disclosure.

FIG. 3 is an exploded perspective view of the electronic device 200 of FIG. 2A, according to various embodiments of the disclosure.

The electronic device 300 of FIG. 3 may be at least partially similar to the electronic device 200 of FIGS. 2A and 2B, or may include other embodiments of an electronic device.

With reference to FIG. 3, the electronic device 300 (e.g., electronic device 200 in FIG. 2A or 2B) may include a side member 310 (e.g., side bezel structure), a first support member 311 (e.g., bracket or support structure), a front plate 320 (e.g., front cover), a display 330 (e.g., display 201 in FIG. 2A), a board 340 (e.g., printed circuit board (PCB), flexible PCB (FPCB), or rigid-flexible PCB (RFPCB)), a battery 350, a second support member 360 (e.g., rear case), an antenna 370, and a rear plate 380 (e.g., rear cover). In an embodiment, at least one of the components (e.g., first support member 311 or second support member 360) may be omitted from the electronic device 300 or other components may be additionally included therein. At least one of the components of the electronic device 300 may be the same as or similar to at least one of the components of the electronic device 200 of FIG. 2A or 2B, and repeated descriptions will be omitted below.

The first support member 311 may be disposed inside the electronic device 300 and may be connected to the side member 310 or may be integrally formed with the side member 310. The first support member 311 may be made of, for example, a metal material and/or a non-metal (e.g., polymer) material. The first support member 311 may have one surface coupled to the display 330 and the other surface coupled to the board 340. A processor, a memory, and/or an interface may be mounted on the board 340. The processor may include, for example, one or more of a central processing unit, an application processor, a graphics processing unit, an image signal processor, a sensor hub processor, and a communication processor.

The memory may include, for example, a volatile memory or a non-volatile memory.

The interface may include, for example, an HDMI, a USB interface, an SD card interface, and/or an audio interface. The interface may, for example, electrically and/or physically connect the electronic device 300 to an external electronic device, and may include a USB connector, an SD card/multimedia card (MMC) connector, or an audio connector.

The battery 350 is a device for supplying power to at least one component of the electronic device 300, and may include, for example, a non-rechargeable primary cell, a rechargeable secondary cell, or a fuel cell. At least a portion of the battery 350 may be disposed substantially coplanar with the board 340, for example. The battery 350 may be integrally disposed inside the electronic device 300. In another embodiment, the battery 350 may be disposed in an attachable and/or detachable manner with the electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may, for example, perform short-range communication with an external device or wirelessly transmit and receive power required for charging. In another embodiment, an antenna structure may be formed by a part of the side bezel structure 310 and/or the first support member 311 or a combination thereof.

In one embodiment, the first substrate 341 and the second substrate 342 are a printed circuit board (PCB), a flexible printed circuit board (FPCB), or a partially flexible material. Hereinafter, the first board 341 will be referred to as a first printed circuit board 341, and the second board 342 will be referred to as a second printed circuit board 342.

In an embodiment, the first printed circuit board 341 and the second printed circuit board 342 may be respectively disposed at positions spaced apart from each other. For example, the first printed circuit board 341 may be disposed in a first direction (e.g., a +y direction in FIG. 3) with respect to the battery 350, and the second printed circuit board 342 may be disposed in the battery 350.) may be disposed in a second direction (e.g., the −y direction of FIG. 3) corresponding to a direction opposite to the first direction. For example, the first printed circuit board 341 and the second printed circuit board 342 may be disposed to be spaced apart from each other with the battery 350 interposed therebetween. The battery 350 may be disposed between the first printed circuit board 341 and the second printed circuit board 342. The positions where the first printed circuit board 341 and the second printed circuit board 342 are disposed and/or types of components disposed therebetween are merely examples. For example, at least one other component (e.g., a plurality of antenna modules) may be disposed between the first printed circuit board 341 and the second printed circuit board 342.

In an embodiment, various electronic components may be disposed on the first printed circuit board 341 and the second printed circuit board 342 to be electrically connected by the printed circuit board. For example, the first printed circuit board 341 may include a processor (e.g., the processor 120 of FIG. 1), a memory (e.g., the memory 130 of FIG. 1), and a communication module (e.g., the communication module 190 of FIG. 1), an antenna module (e.g., the antenna module 197 of FIG. 1), a camera module (e.g., the camera module 180 of FIG. 1), an audio module (e.g., the audio module 170 of FIG. 1), a sensor module (e.g., the sensor module 176 of FIG. 1), an interface module for connection with other electronic devices (e.g., the interface 177 of FIG. 1), and a connection terminal (e.g., the connection terminal 178 of FIG. 1). The arrangement of the electronic components described above is only an example, and various electronic components may be arranged on the first printed circuit board 341 and the second printed circuit board 342, according to various design elements.

In an embodiment, the first printed circuit board 341 and the second printed circuit board 342 may be electrically connected by a connection member 410. The connection member 410 may include a plurality of wires for electrically connecting the first printed circuit board 341 and the second printed circuit board 342. The connection member 410 may be formed of a flexible material. For example, the connection member 410 may have a partial section due to a step difference and/or due to a height difference between the first printed circuit board 341 and the second printed circuit board 342 and other components (e.g., the battery 350). It may be formed of a flexible material so as to be deformable. For example, the connection member 410 may include a flexible printed circuit (FPC). One end of the connection member 410 may be electrically connected to the first printed circuit board 341, and the other end of the connection member 410 may be electrically connected to the second printed circuit board 342. A portion of the connection member 410 may pass/extend over (i.e., partially cover or overlap) the battery 350 disposed between the first printed circuit board 341 and the second printed circuit board 342.

An electronic device 400 described hereinafter may be similar at least in part to the electronic devices 101, 200, and 300 shown in FIGS. 1, 2A, 2B, and 3. In the following description, the same reference numerals will be used for the same or similar components as those shown in FIGS. 1, 2A, 2B and 3, and overlapping descriptions will be omitted.

Figure 4A:
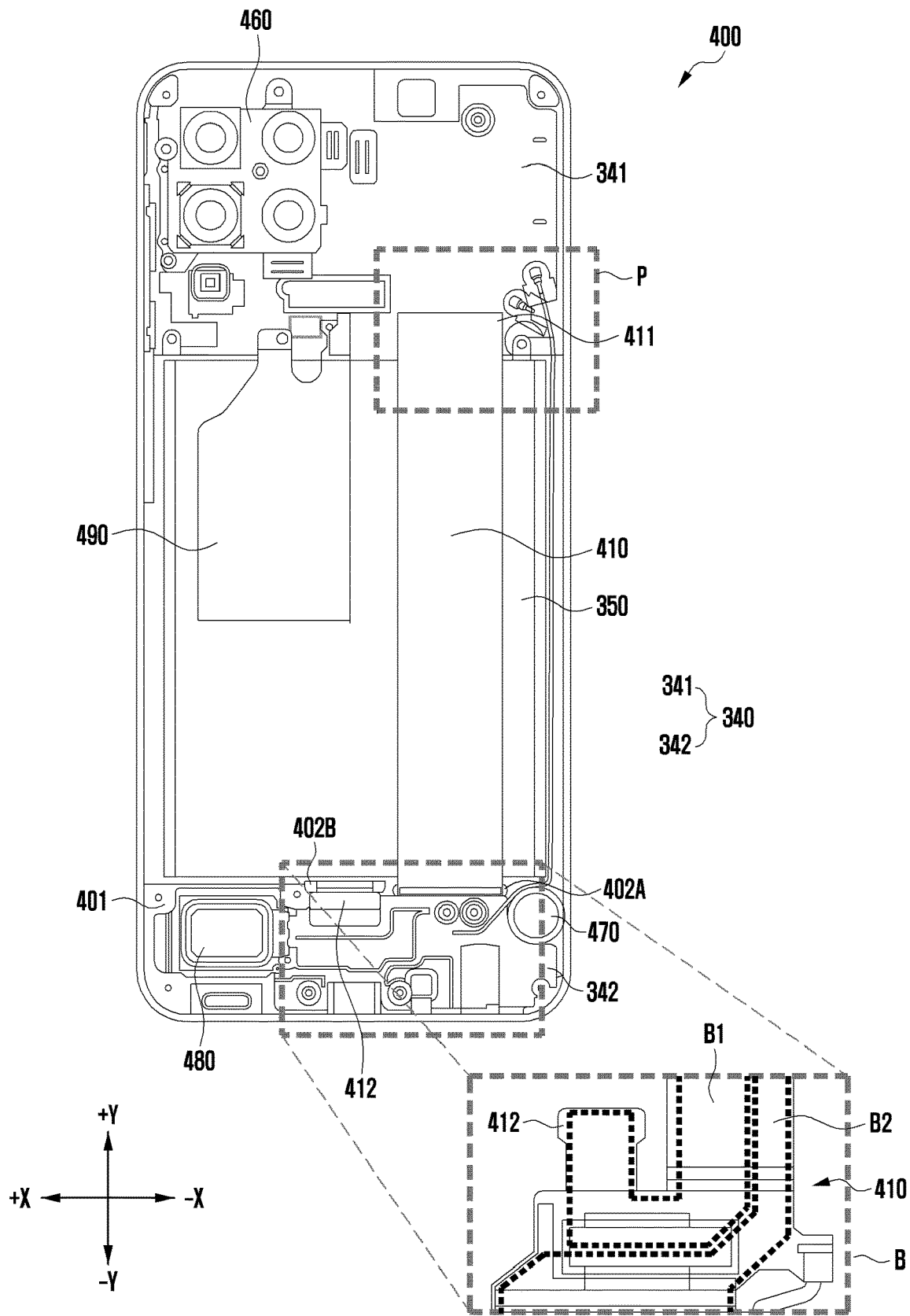
FIG. 4A is a diagram illustrating a state in which some components are removed from an electronic device, according to various embodiments of the disclosure.

FIG. 4A is a diagram illustrating a state in which some components are removed from an electronic device, according to various embodiments of the disclosure. FIG. 4A shows a state where a rear plate (e.g., the rear plate 211 in FIG. 2B) is removed from the electronic device. FIG. 4A shows a state where the electronic device, for example, the electronic device of FIG. 3, is viewed from the rear (a state viewed from the negative Z direction to the positive Z direction in FIG. 3).

According to various embodiments, the first printed circuit board 341 is disposed in an upper portion (e.g., in the positive Y direction in FIG. 4A) of the electronic device 400, and the second printed circuit board 342 is disposed in a lower portion (e.g., in the negative Y direction in FIG. 4A) of the electronic device 400, which may be spaced apart from each other. The second printed circuit board 342 may need to be electrically connected to the first printed circuit board 341 for the operation of electronic components (a speaker module 480 and a vibration generating module 470) disposed on the second printed circuit board 342. When the second printed circuit board 342 is electrically connected to the first printed circuit board 341, a processor (e.g., the processor 120 in FIG. 1) disposed on the first printed circuit board 341 is capable of receiving a signal from the electronic component disposed on the second printed circuit board 342 or transmitting a driving command signal to the electronic component disposed on the second printed circuit board 342.

In an embodiment, electronic components such as a camera module 460 (e.g., the camera module 180 in FIG. 1) and an antenna module 490 (e.g., the antenna module 197 in FIG. 1) may be electrically connected to the first printed circuit board 341. The antenna module 490 shown in FIG. 4A may be, for example, an MST antenna 490. The MST antenna 490 may be, for example, an antenna that transmits or receives a magnetic signal. In an embodiment, the MST antenna 490 may support a magnetic payment scheme.

With reference to FIG. 4A, the connection member 410 may extend to the second printed circuit board 342 from the first printed circuit board 341 so as to electrically connect the first and second printed circuit boards 341 and 342 to each other. The connection member 410 may pass over (i.e., overlap or partially cover) the battery 350 disposed between the first and second printed circuit boards 341 and 342. In FIG. 4A, the connection member 410 is depicted to overlap one surface of the battery 350, but in some embodiments, the connection member 410 may be disposed to overlap the other surface of the battery 350. In another embodiment, a plurality of connection members may be configured so that some of the connection members overlap or partially cover one surface of the battery 350 and the others overlap or partially cover the other surface of the battery 350.

The connection member 410 may be connected to the first and second printed circuit boards 341 and 342 in various ways. For example, the connection member 410 may include a first connection part 411 and a second connection part 412 for connection with the first printed circuit board 341 and the second printed circuit board 342. The first connection part 411 is a part located at one end of the connection member 410 and connected to the first printed circuit board 341, and the second connection part 412 is a part located at the other end of the connection member 410 and connected to the second printed circuit board 342. The connection member 410 may have various shapes. For example, the connection member 410 may have a shape elongated in one direction as shown in FIG. 3, and the connection member 410 may have a portion formed in a "U" shape (e.g., a region B1 where wiring connected to the second connection part 412 is disposed) as shown in a region B of FIG. 4A. The region B of FIG. 4A may be understood as depicting the shape of the connection member 410 covered by the second printed circuit board 342.

According to various embodiments, a portion of the connection member 410 may pass through a first hole 402A and a second hole 402B formed in a cover housing 401, and thus the second connection part 412 may be connected to the second printed circuit board 342. The shape of the connection member 410 shown in FIG. 4A is merely exemplary, and the connection member 410 may have various shapes capable of electrically connecting the first and second printed circuit boards 341 and 342 to each other.

The first connection part 411 and the second connection part 412 may be electrically connected to a plurality of wirings included in the connection member 410. When the first connection part 411 and the second connection part 412 are electrically connected to the first printed circuit board 341 and the second printed circuit board 342, respectively, the first printed circuit board 341 and the second printed circuit board 342 are electrically connected to each other through the plurality of wirings included in the connection member 410. The first connection part 411 and the second connection part 412 may have various shapes depending on a connection scheme between the printed circuit board 340 and the connection member 410. For example, in a case that the connection member 410 and the printed circuit board 340 are electrically connected to each other in a pin-socket scheme, the first connection part 411 and the second connection part 412 may be formed in a shape that allows insertion into a socket (e.g., the socket 3411 in FIG. 4B) disposed in the printed circuit board 340. In a case that the connection member 410 and the printed circuit board 340 are electrically connected through soldering, the first connection part 411 and the second connection part 412 may be formed of pads for solder bonding. In some embodiments, the first connection part 411 and the second connection part 412 may be electrically connected to the first printed circuit board 341 and the second printed circuit board 342, respectively, in different schemes.

According to various embodiments, the connection member 410 may electrically connect a display module (e.g., the display module 800 in FIG. 8) to the first printed circuit board 341. The display module may include a display panel (e.g., the display panel 810 in FIG. 8) having a plurality of light emitting devices (e.g., OLED), and a display connection part (e.g., the display connector part 820 in FIG. 8) electrically connected to the display panel. The connection member 410 may be electrically connected to the display connection part. When the display connection part and the connection member 410 are electrically connected to each other, the display panel is electrically connected to the first printed circuit board 341. In some embodiments, as shown in the region B of FIG. 4A, the connection member 410 may be integrally formed with the display connection part. In a case that the connection member 410 electrically connects the display module to the first printed circuit board 341 and electrically connects the first and second printed circuit boards 341 and 342, the connection member 410 may include a plurality of wirings for electrically connecting the display module and the first printed circuit board 341 and a plurality of wirings for electrically connecting the first and second printed circuit boards 341 and 342. With reference to the connection member 410 shown in the region B of FIG. 4A, the connection member 410 may include a region B1 where the wirings for connecting the first and second printed circuit boards 341 and 342 are disposed, and a region B2 where the wirings for connecting the display module and the first printed circuit board 341 are disposed. In some embodiments, at least some of the wirings for connecting the first and second printed circuit boards 341 and 342 and at least some of the wirings for connecting the display module and the second printed circuit board 342 may be disposed on different layers in the connection member 410. In this case, the region B1 where the wirings for connecting the first and second printed circuit boards 341 and 342 are disposed and the region B2 where the wirings for connecting the display module and the first printed circuit board 341 are disposed may overlap at least part with each other.

In the electronic device 400, according to an embodiment of the disclosure, an electrical connection scheme between the connection member 410 and the printed circuit board 340 is not limited by the above description. In addition to the above-described scheme, the electrical connection scheme between the connection member 410 and the printed circuit board 340 may include various schemes that can be easily applied by those skilled in the art. In some embodiments, the connection member 410 may be integrally formed with the first printed circuit board 341 or the second printed circuit board 342.

Figure 4B:
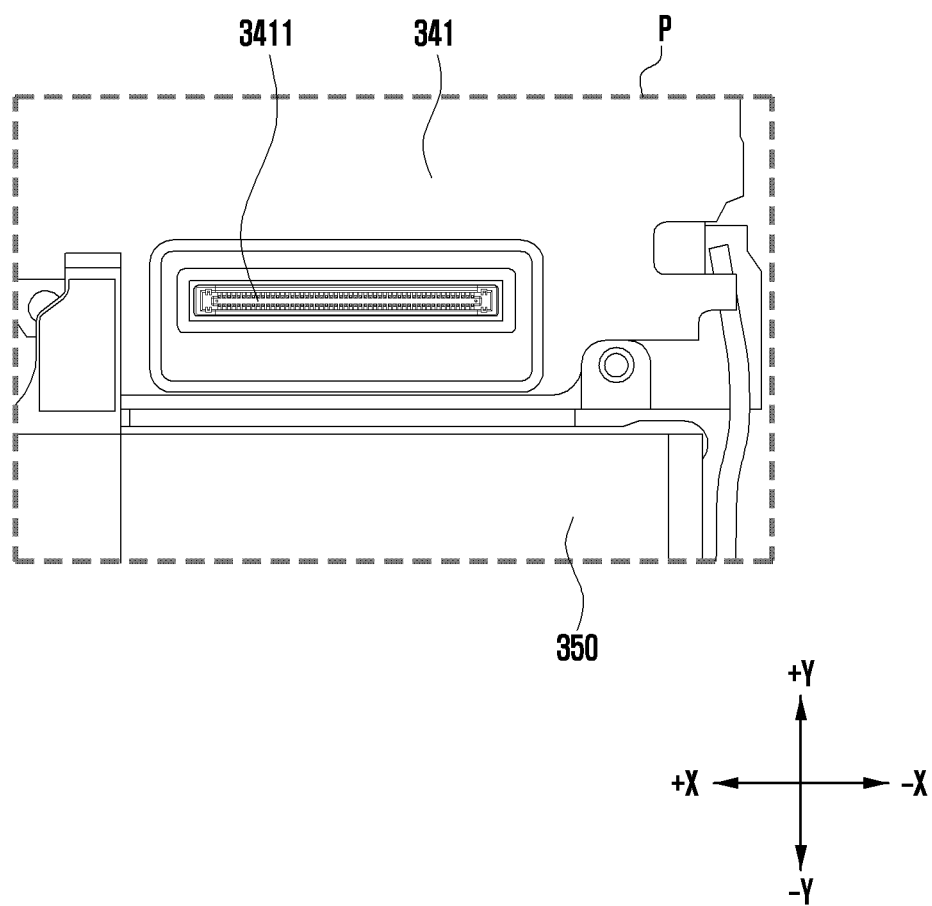
FIG. 4B is an enlarged diagram of a region P in FIG. 4A.

FIG. 4B is an enlarged diagram of a region P in FIG. 4A. FIG. 4B depicts a state in which the connection member 410 shown in FIG. 4A is removed for convenience of description.

In an embodiment, a socket 3411 may be formed in the first printed circuit board 341. The first connection part 411 included in the connection member 410 for connecting the first and second printed circuit boards 341 and 342 may be inserted into the socket 3411 of the first printed circuit board 341 to electrically connect the first printed circuit board 341 and the connection member 410. Therefore, a position at which the socket 3411 is disposed in the first printed circuit board 341 may determine a position at which the connection member 410 is connected to the first printed circuit board 341.

In manufacturing the electronic device 400 of various shapes or models, the same use of the first printed circuit board 341, the second printed circuit board 342, and the connection member 410 may be advantageous in terms of reducing the production cost of the electronic device 400. However, a distance between the first and second printed circuit boards 341 and 342 may vary depending on a change in design factors such as an external shape change of the electronic device 400, an increase in battery capacity, and a change in component arrangement.

As shown in FIG. 4B, in a case that the position of the socket 3411 in which the connection member 410 is connected to the first printed circuit board 341 is fixed, it may be necessary to use the connection member 410 having a different length or change the position of the socket 3411 formed in the first printed circuit board 341, depending on a change in distance between the first and second printed circuit boards 341 and 342.

The electronic device 400, according to various embodiments of the disclosure, can improve the durability and/or reliability of the connection member 410 and increase the production efficiency through an intermediate member (e.g., the intermediate member 500 in FIG. 5A) disposed between the printed circuit board 340 and the connection member 410.

Figure 5A:
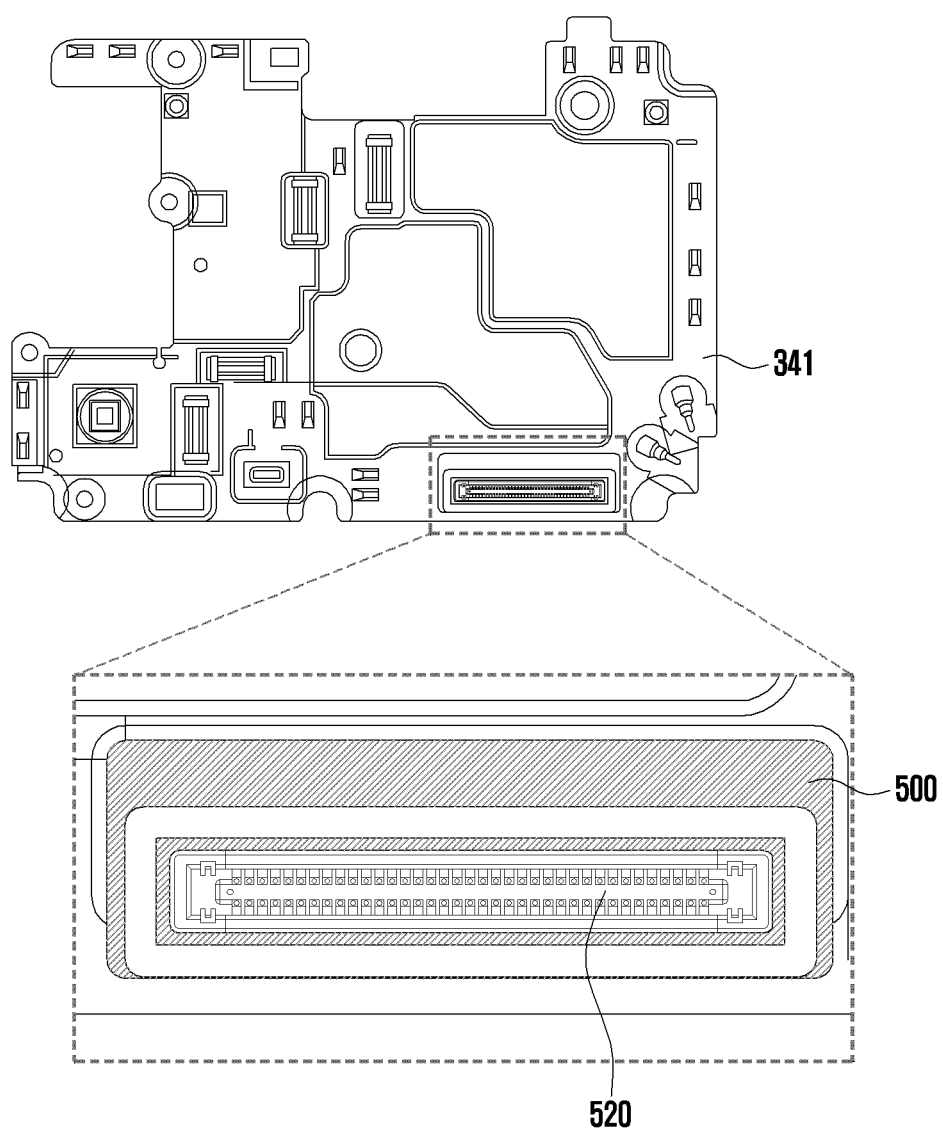
FIG. 5A is a plan diagram illustrating a printed circuit board on which an intermediate member is disposed, according to various embodiments of the disclosure.
Figure 5B:
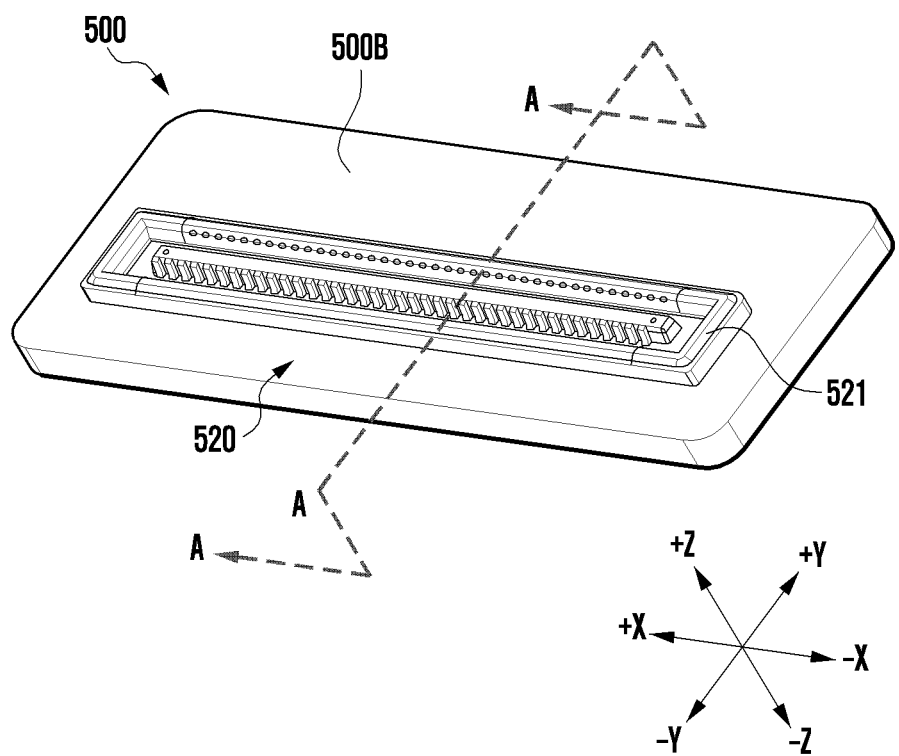
FIGS. 5B and 5C are perspective diagram illustrating an intermediate member, according to various embodiments of the disclosure.
Figure 5C:
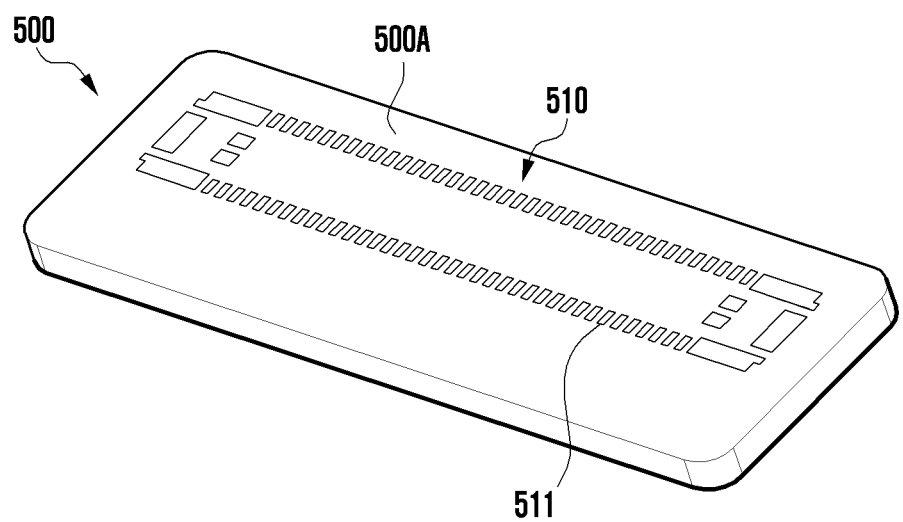
Figure 5C:
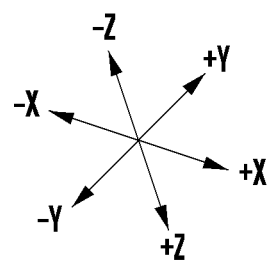
Figure 6B:
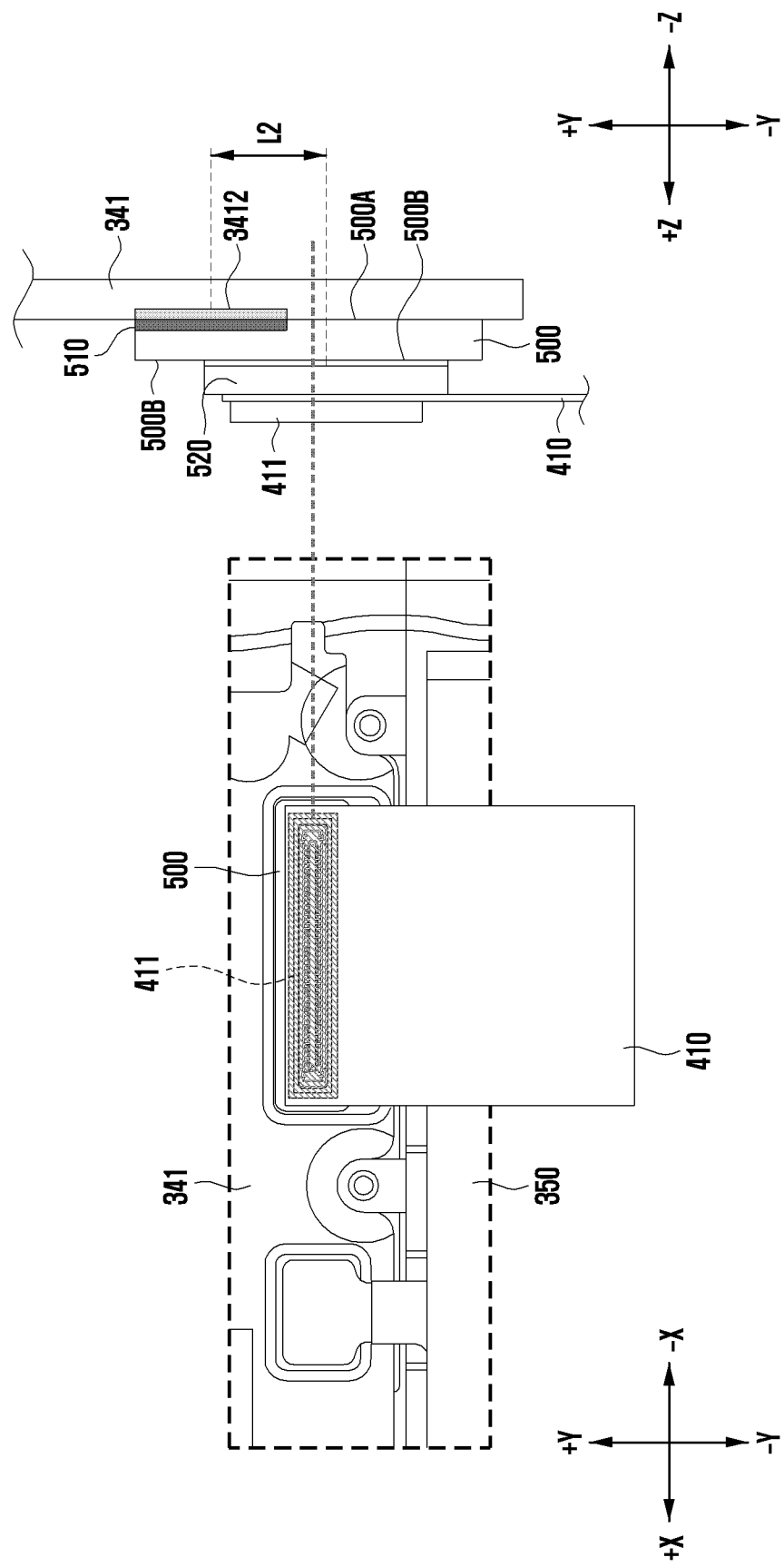
Figure 7:
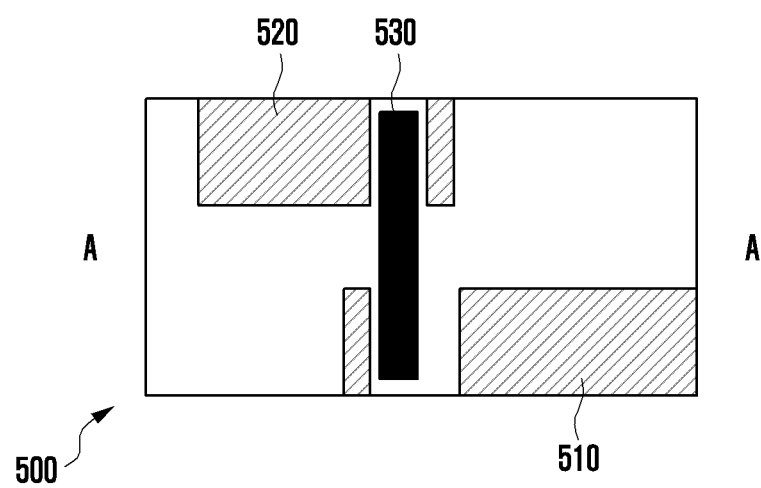
FIG. 7 is a schematic cross-sectional diagram illustrating an intermediate member, according to various embodiments of the disclosure.

FIG. 5A is a plan diagram illustrating a printed circuit board on which an intermediate member is disposed, according to various embodiments of the disclosure. FIGS. 5B and 5C are perspective diagrams illustrating an intermediate member, according to various embodiments of the disclosure. FIGS. 6A and 6B are diagrams illustrating a state in which a connection point of a connection member is changed by an intermediate member, according to various embodiments of the disclosure. FIG. 7 is a schematic cross-sectional diagram illustrating an intermediate member, according to various embodiments of the disclosure.

In FIGS. 6A and 6B, a second connector 520 is depicted in a portion corresponding to the first connection part 411, but this is for convenience of understanding. In actuality, the second connector 520 may not be seen because it is covered by the first connection part 411. FIG. 7 is a schematic cross-sectional view illustrating the intermediate member 500 shown in FIG. 5B, taken along the line A-A.

With reference to FIGS. 5A to 7, a first intermediate member 500 may be disposed on the first printed circuit board 341. According to various embodiments, the first intermediate member 500 may include a first connector 510 and the second connector 520.

In an embodiment, the first connector 510 may be disposed on a first surface 500A of the first intermediate member 500, and the second connector 520 may be disposed on a second surface 500B of the first intermediate member 500. The second surface 500B may be opposite to the first surface 500A. For example, in FIGS. 5B and 5C, the first surface 500A is a surface facing the negative Z direction, and the second surface 500B is a surface facing the positive Z direction.

Figure 9:
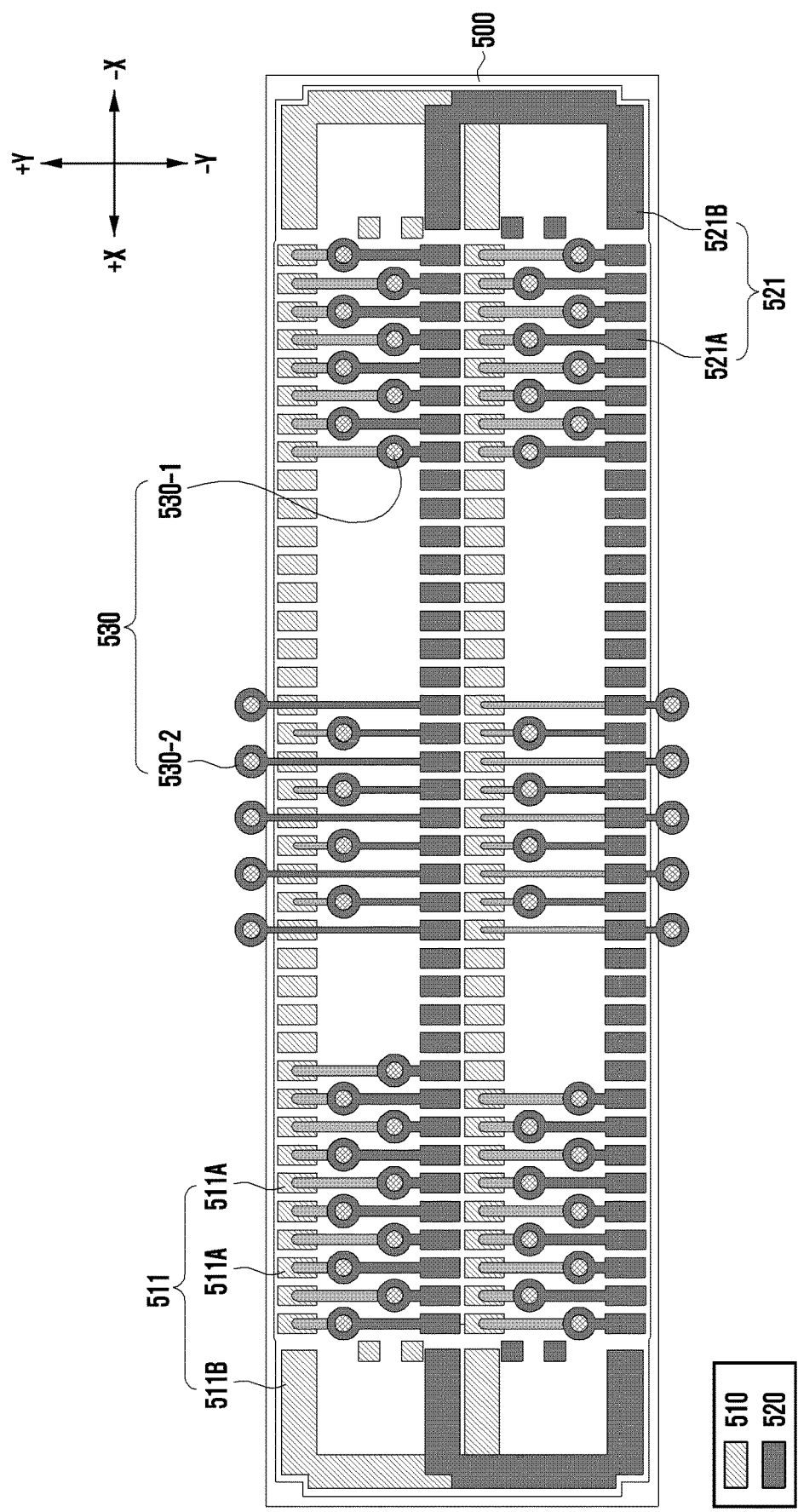
FIG. 9 is a schematic diagram illustrating pads and pins of an intermediate member, according to various embodiments of the disclosure.

With reference to FIG. 5B, in an embodiment, the second connector 520 may include a socket 521 having a plurality of pins (e.g., pins 521A and 521B in FIG. 9). For example, the second connector 520 may be the socket 521. With reference FIG. 5C, in an embodiment, the first connector 510 may include a connecting pad 511. For example, the first connector 510 may be the connecting pad 511. By soldering the connecting pad 511 included in the first connector 510 to a board pad 3412 included in the first printed circuit board 341, the first intermediate member 500 may be fixed and electrically connected to the first printed circuit board 341. A more detailed embodiment of the socket 521 and the connecting pad 511 included in the first intermediate member 500 is described with reference to FIG. 9.

With reference to FIGS. 6A and 6B, the first connector 510 disposed on the first surface 500A of the first intermediate member 500 and the second connector 520 disposed on the second surface 500B of the first intermediate member 500 may be spaced apart from each other in a direction (e.g., the Z-axis direction in FIG. 6A) perpendicular to the elongated direction of the first intermediate member 500. Also, the first connector 510 and the second connector 520 may be separated from each other in a first direction (e.g., the Y-axis direction in FIG. 6A). For example, in a state that the first intermediate member 500 is disposed on the first printed circuit board 341, a distance of the first connector 510 to and a distance of the second connector 520 to a component (e.g., the battery 350) adjacent to the first printed circuit board 341 may be different from each other.

In an embodiment, the first connector 510 may be electrically connected to the first printed circuit board 341. For example, the board pad 3412 may be disposed at a fixed position on the first printed circuit board 341. The first connector 510 may have the connecting pad (e.g., the connecting pad 511 in FIG. 9) formed to contact the board pad 3412. In a state that the board pad 3412 and the connecting pad are in contact with each other, the board pad 3412 and the connecting pad are electrically connected through an electrical bonding method such as soldering, whereby the first printed circuit board 341 and the first connector 510 can be electrically connected. This electrical connection method between the first connector 510 and the first printed circuit board 341 is merely exemplary, and the first connector 510 and the first printed circuit board 341 may be connected in various other method.

In an embodiment, the second connector 520 may be electrically connected to the connection member 410. For example, the second connector 520 may have the socket (e.g., the socket 521 in FIG. 9) into which the first connection part 411 of the connection member 410 is inserted. When the first connection part 411 of the connection member 410 is inserted into the socket of the second connector 520, the connection member 410 and the second connector 520 may be electrically connected to each other. This electrical connection method between the second connector 520 and the connection member 410 is merely exemplary, and the second connector 520 and the connection member 410 may be connected in various other methods.

With reference to FIGS. 6A and 6B, a point at which the connection member 410 is connected to the first printed circuit board 341 may be changed by using different first intermediate members 500. Even though the board pad 3412 of the first printed circuit board 341 has a fixed position and the connection member 410 is unvaried in length, a connection position between the connection member 410 and the first printed circuit board 341 may vary depending on the degree of separation in the first direction between the first connector 510 and the second connector included in the first intermediate member 500.

A separation distance in the first direction between the first and second connectors 510 and 520 may be understood as, for example, a separation distance L1 or L2 in the first direction between the center of the first connector 510 and the center of the second connector 520. In an embodiment, the distance L1 between the center of the first connector 510 and the center of the second connector 520 shown in FIG. 6A and the distance L2 between the center of the first connector 510 and the center of the second connector 520 shown in FIG. 6B may be different. Comparing FIGS. 6A and 6B, the separation distance L1 in the first direction between the first and second connectors 510 and 520 of the first intermediate member 500 shown in FIG. 6A may be greater than the separation distance L2 in the first direction between the first and second connectors 510 and 520 of the first intermediate member 500 shown in FIG. 6B. Because the first connector 510 is electrically connected to the first printed circuit board 341 and the second connector 520 is electrically connected to the connection member 410, a positional relationship between the connection member 410 and the first printed circuit board 341 may vary in FIGS. 6A and 6B. For example, a position where the connection member 410 is connected to the first intermediate member 500 in FIG. 6A may be close to the battery 350 disposed adjacent to the first printed circuit board 341, and a position where the connection member 410 is connected to the first intermediate member 500 in FIG. 6B may be relatively far from the battery 350.

In an embodiment, as shown in FIG. 7, the first connector 510 and the second connector 520 may be electrically connected to each other through a via-hole 530 formed in the first intermediate member 500. The via-hole 530 may be a hole formed to pass through at least a portion of the first intermediate member 500. The first connector 510 and the second connector 520 may be electrically connected to each other by a conductive material filled in the via-hole 530. The first connector 510 is electrically connected to the first printed circuit board 341, the second connector 520 is electrically connected to the connection member 410, and the first and second connectors 510 and 520 are electrically connected to each other, so that the first printed circuit board 341 and the connection member 410 can be electrically connected to each other.

In an embodiment, even if the distance between the first printed circuit board 341 and the second printed circuit board 342 is changed depending on the design of the electronic device 400, only replacing the first intermediate member 500 having a different distance relationship between the first and second connectors 510 and 520 may make it possible to use the same first printed circuit board 341, second printed circuit board 342, and connection member 410 in an electronic device having a different design factor (e.g., the overall shape of the electronic device, and the arrangement of components included in the electronic device). Compared to changing all of the first printed circuit board 341, the second printed circuit board 342, and the connection member 410, only replacing the first intermediate member 500 having a relatively simple structure may result in a reduction in manufacturing costs of the electronic device.

As described above, the first intermediate member 500 may be disposed on the first printed circuit board 341 and the connection position between the connection member 410 and the first printed circuit board 341 may be varied. Similarly, a second intermediate member similar to the first intermediate member 500 applied to the first printed circuit board 341 may be used for the second printed circuit board 342.

Hereinafter, on the assumption that the first printed circuit board 341 shown in FIGS. 6A and 6B is the second printed circuit board 342, and that the first intermediate member 500 is the second intermediate member, the second printed circuit board 342 and the second intermediate member 500 will be described.

In an embodiment, the second intermediate member 500 may include a third connector 510 and a fourth connector 520. The third connector 510 may be disposed on a third surface 500A of the second intermediate member 500, and the fourth connector 520 may be disposed on a fourth surface 500B of the second intermediate member 500. Here, the third surface 500A and the fourth surface 500B may refer to surfaces of the second intermediate member 500 opposite to each other, and the third surface 500A may be a surface where the second intermediate member 500 is in contact with the second printed circuit board 342.

In an embodiment, the third connector 510 of the second intermediate member 500 is connected to the second printed circuit board 342, the fourth connector 520 is connected to the connection member 410, and the third and fourth connectors 510 and 520 are electrically connected to each other through the via-hole 530 formed in the second intermediate member 500. Therefore, the connection member 410 and the second printed circuit board 342 can be electrically connected to each other by the second intermediate member 500.

In an embodiment, the third and fourth connectors 510 and 520 of the second intermediate member 500 may be separated from each other in the Y-axis direction of FIG. 6A. By changing the degree of separation between the third and fourth connectors 510 and 520 of the second intermediate member 500, the position at which the connection member 410 is connected to the second printed circuit board 342 can be varied.

In some embodiments, the electronic device may be constructed using only the first intermediate member 500 for the first printed circuit board 341 or only the second intermediate member 500 for the second printed circuit board 342. In another embodiment, it is possible to use the first intermediate member 500 for the first printed circuit board 341 and also use the second intermediate member 500 for the second printed circuit board 342.

Figure 8:
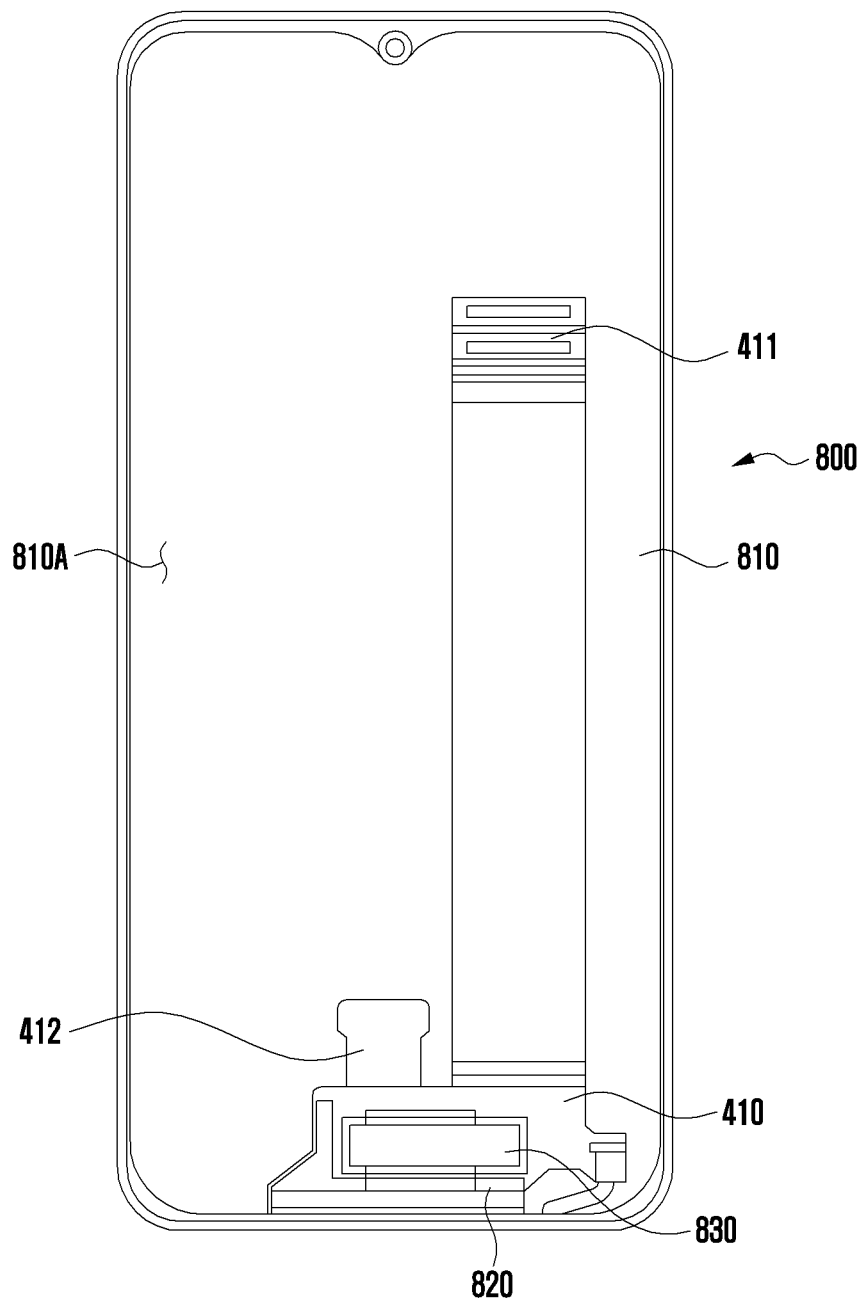
FIG. 8 is a diagram illustrating a display module and a connection member electrically connected thereto, according to various embodiments of the disclosure.

FIG. 8 is a diagram illustrating a display module and a connection member electrically connected thereto, according to various embodiments of the disclosure.

According to various embodiments, the electronic device may include a display module 800. The display module 800 may include a display panel 810 and a display connector 820.

With reference to FIG. 8, the display connector 820 electrically connected to the display panel 810 may be bent in part and disposed on a rear surface 810A of the display panel 810. The display connector 820 may be formed integrally with a substrate of the display panel 810 (e.g., a chips-on-panel (COP) structure), or formed separately from the substrate of the display panel 810 and electrically connected to the substrate of the display panel 810 (e.g. a chips-on-film (COF) structure). In an embodiment, a control circuit 830 for controlling at least some functions of the display module 800 may be disposed in the display connector 820. For example, the control circuit 830 may include a display driver IC (DDI). In a case that the display module 800 is an in-cell type or on-cell type touch display module 800, the control circuit 830 may include a touch display driver IC (TDDI).

According to various embodiments, the connection member 410 may electrically connect the display module 800 and the first printed circuit board (e.g., the first printed circuit board 341 in FIG. 4A). The connection member 410 is electrically connected to the display connector 820 electrically connected to the display panel 810 of the display module 800, and also electrically connected to the first printed circuit board, thereby electrically connecting the display module 800 and the first printed circuit board.

With reference to FIG. 8, the connection member 410 may include a second connection part 412 electrically connected to the second printed circuit board (e.g., the second printed circuit board 342 in FIG. 4A). With reference to FIG. 4A together, the second connection part 412 may be inserted into the first hole 402A and the second hole 402B formed in the cover housing 401 (e.g., the support member 362 in FIG. 3) disposed to cover at least in part the connection member 410 and the second printed circuit board 342, and then electrically connected to the second printed circuit board 342. In some cases, a portion adjacent to the second connection part 412 may be bent to electrically connect the second printed circuit board 342 and the second connection part 412.

In an embodiment, the connection member 410 may electrically connect the display module 800 and the second printed circuit board 342 to the first printed circuit board 341. A portion of the connection member 410 is electrically connected to the display connector part 820 of the display module 800, and the first and second connection parts 411 and 412 of the connection member 410 may be electrically connected to the first and second printed circuit boards 341 and 342, respectively. Some of a plurality of wirings included in the connection member 410 are wirings related to the display module 800, and the others may be wirings related to an electronic component disposed on or connected to the second printed circuit board 342.

In the above, it has been described that the connection member 410 electrically connects the display module 800 and the second printed circuit board 342 to the first printed circuit board 341, but the connection member 410 may consist of a plurality. For example, the first connection member may connect the display module 800 to the first printed circuit board 341, and the second connection member may connect the second printed circuit board 342 to the first printed circuit board 341.

FIG. 9 is a schematic diagram illustrating pads and pins of an intermediate member, according to various embodiments of the disclosure.

According to various embodiments, the intermediate member 500 may include the first connector 510 and the second connector 520. With reference to FIG. 6A together, the first connector 510 may be disposed on the first surface 500A of the intermediate member 500, and the second connector 520 may be disposed on the second surface 500B of the intermediate member 500 opposite to the first surface 500A.

As illustrated in FIG. 9, the first connector 510 and the second connector 520 may be separated from each other in the first direction (e.g., the Y-axis direction of FIG. 9).

According to various embodiments, the first connector 510 may include the connecting pad 511. For example, the first connector 510 may be the connecting pad 511. The second connector 520 may include the socket 521. For example, the second connector 520 may be the socket 521. The second connector 520 may be configured in the form of a socket as shown in FIG. 5A. The socket 521 may have a plurality of pins 521A and 521B.

With reference to FIG. 9, the connecting pad 511 may have a plurality of pads 511A and 511B. The connecting pad 511 may contact a board pad (e.g., the board pad 3412 in FIG. 6A) formed on the first printed circuit board (e.g., the first printed circuit board 341 in FIG. 6A). The plurality of pads 511A and 511B included in the connecting pad 511 may correspond one-to-one to the plurality of pads 511A and 511B included in the board pad formed on the first printed circuit board. In a state where the plurality of pads 511A and 511B of the connecting pad 511 and the plurality of pads of the board pad are in contact with each other, the connecting pad 511 and the board pad may be electrically connected by an electrical bonding method such as soldering.

With reference to FIG. 9, the socket 521 may include the plurality of pins 521A and 521B. The plurality of pins 521A and 521B included in the socket 521 may correspond one-to-one to the plurality of pads 511A and 511B included in the connecting pad 511. The plurality of pads 511A and 511B and the plurality of pins 521A and 521B may be electrically connected through the via-holes 530 formed to pass through the intermediate member 500. Thus, the number of the via-holes 530 may be equal to the number of the plurality of pads 511A and 511B and the number of the plurality of pins 521A and 521B.

When the first connection part 411 of the connection member 410 is electrically connected to the second connector 520, a plurality of wirings included in the connection member 410 may be electrically connected to the plurality of pins 521A and 521B included in the second connector 520, respectively.

In an embodiment, among the plurality of pads 511A and 511B included in the connecting pad 511, the pads 511B disposed on both sides of the first connector 510 may be power pads 511B that transmit power. The pads 511B disposed on both sides of the first connector 510 may be electrically connected to the power pins 521B disposed on both sides of the second connector 520 through the via-holes 530. The power pins 521B of the second connector 520 may be electrically connected to wirings of the connection member 410 for transmitting power of the battery (e.g., the battery 350 in FIG. 4A). As shown in FIG. 9, the power pad 511B and the power pin 521B may be formed to have a larger width than the other pads 511A or the other pins 521A. Forming the power pad 511B and the power pin 521B to have a large width allows the power of the battery to be stably transmitted to the first printed circuit board. Alternatively or additionally, when the power pads 511B disposed on both sides of the first connecting pad 511 and having a larger width than the other pads are fixed to the board pad formed on the first printed circuit board in a manner such as soldering, fixing between the first connecting pad 511 and the first printed circuit board may be stably maintained.

With reference to FIG. 9, the via-holes 530 may include first via-holes 530-1 disposed in an inside area of the first connector 510 or the second connector 520, and second via-holes 530-2 disposed in an outside area of the first connector 510 or the second connector 520. When the via-holes 530 (e.g., the first via-holes 530-1) are disposed in the inside area of the connector 510 or 520, the size of the intermediate member 500 may be reduced. On the other hand, when the via-holes 530 (e.g., the second via-holes 530-2) are disposed in the outside area of the connector 510 or 520, the size of the via-holes 530 may be increased in comparison with the case where the via-holes 530 are disposed in the inside area of the connector 510 or 520, and thus the connection stability between the first and second connectors 510 and 520 can be improved. The diameter of the second via-hole 530-2 may be about 0.4 mm, and the diameter of the first via-hole 530-1 may be about 0.35 mm.

TABLE 1

| | | | |
|---|---|---|---|
| Display | 2 | LED_A | 1 LED_K2 |
| Power | 4 | NC | 3 LED_K1 |
| | 6 | AVDD | 5 NC |
| | 8 | VDDI | 7 AVEE |
| | 10 | NC | 9 NC |
| Display | 12 | GND | 11 D2P |
| Data | 14 | DIP | 13 D2N |
| | 16 | DIN | 15 GND |
| | 18 | GND | 17 CLKP |
| | 20 | DOP | 19 CLKN |
| | 22 | DON | 21 GND |
| | 24 | GND | 23 D3P |
| | 26 | LCD_TE | 25 D3N |
| | 28 | LEDPWM | 27 GND |
| | 30 | TP_SPI_SS | 29 GPIO1 |
| Display | 32 | TSP_INT | 31 TP_SP1_SCL |
| Touch | 34 | RESET | 33 TP_SP1_MOSI |
| | 36 | GND | 35 TP_SP1_MISO |
| | 38 | GND(ID_1 pin) | 37 NC |
| 1st Electronic | 40 | BAT_THM | 39 RFFE4_DATA |
| Component | 42 | HALL_INT | 41 RFFE4_CLK |
| | 44 | VIO18_PMU | 43 GND |

TABLE 1-continued

| | | | |
|---|---|---|---|
| 2nd Electronic Component | 46 VDD_GRIP_3P0 | 45 FM_OUT | |
| | 48 GRIP2_I2C_SDA_1P8 | 47 FM_RX_N_6625 | |
| | 50 GRIP2_I2C_SCL_1P8 | 49 GND | |
| 3rd Electronic Component | 52 GND(ID_2 pin) | 51 GRIP_INT_2 | |
| | 54 GND | 53 EAR_MIC_GND | |
| | 56 CC2 | 55 EAR_MIC_P | |
| | 58 CC1 | 57 EAR_L_DET | |
| | 60 GND | 59 GND | |
| 4th Electronic Component | 62 USB_D_N | 61 EAR_OUT_L_IN | |
| | 64 USB_D_P | 63 EAR_OUT_FB | |
| | 66 GND | 65 EAR_OUT_R_IN | |
| | 68 MAINMIC_N | 67 GND | |
| 5th Electronic Component | 70 MAINMIC_P | 69 SPK_OUT_P | |
| | 72 VDD_MAIN_MICBIAS_2P8 | 71 SPK_OUT_P | |
| | 74 REGION_DET_ADC | 73 SPK_OUT_N | |
| | 76 GND(ID_3 pin) | 75 SPK_OUT_N | |
| 6th Electronic Component | 78 RF_SEL(SUB_DET) | 77 GND | |
| | 79 GND | 81 VBUS_OVP | |
| | 80 GND | 82 VBUS_OVP | |
| | 83 GND | 84 VBUS_OVP | |

Table 1 is a detailed pin map regarding the plurality of pads 511A and 511B included in the first connector 510 and the plurality of pins 521A and 521B included in the second connector 520. Numbers in Table 1 may indicate the plurality of pads 511A and 511B included in the first connector 510 and the plurality of pins 521A and 521B included in the second connector 520.

With reference to Table 1, wirings related to the first to sixth electronic components disposed on or connected to the display module (e.g., the display module 800 in FIG. 8) and the second printed circuit board (e.g., the second printed circuit board 342 in FIG. 4A) may be electrically connected to the first printed circuit board through the connection member 410 and the intermediate member 500. In an embodiment, the first electronic component may be an antenna module, the second electronic component may be an FM radio component, the third electronic component may be a microphone module, the fourth electronic component may be an earphone terminal, the fifth electronic component may be a speaker module, and the sixth electronic component may be an interface module (e.g., a USB connector).

In an embodiment, a ground pad (e.g., pad 43, pad 49, pad 67, etc. in Table 1) connected to the ground may be disposed between pads (or pins) related to the electronic components disposed on the second printed circuit board. The ground pad may improve signal transmission quality by blocking noise that may be generated during transmission of signals related to different electronic components through one connection member 410. For example, between pads (e.g., pads 40 to 42 in Table 1) related to the first electronic component and pads (e.g., pads 46 to 48 in Table 1) related to the second electronic component, a ground pad (e.g., pad 43 in Table 1) may be disposed. This ground pad may reduce noise between the first and second electronic components.

In FIG. 9, for clarity of illustration, only some of the plurality of elements (e.g., the plurality of pads 511A and 511B, the plurality of pins 521A and 521B, the first via-holes 530-1, and the second via-hole 530-2) are indicated with reference numerals. Thus, like elements may be understood by reference to like reference numerals.

Figure 10A:
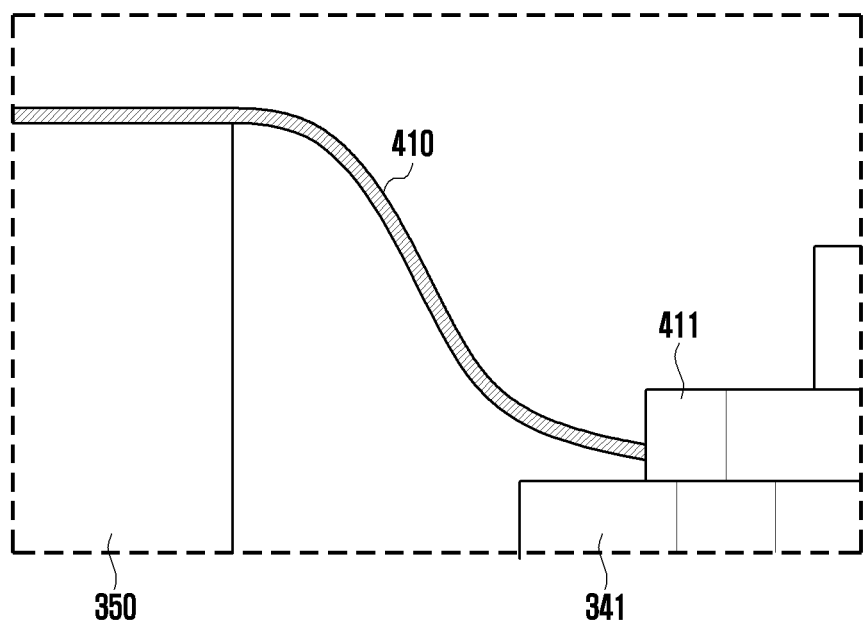
FIGS. 10A and 10B are diagram comparing the degree of deformation of a connection member depending on the presence or absence of an intermediate member, according to various embodiments of the disclosure.
Figure 10B:
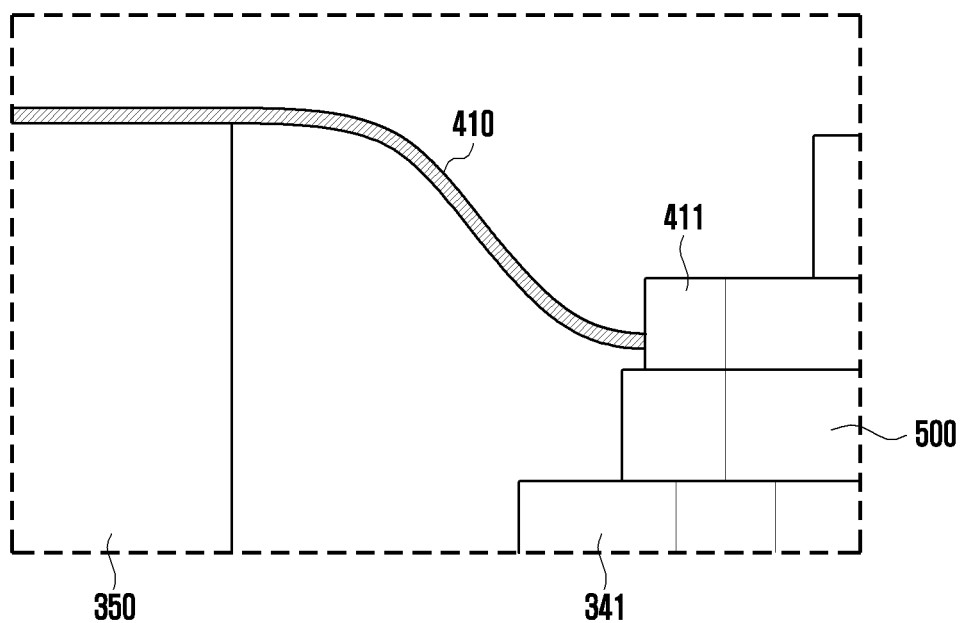

FIGS. 10A and 10B are diagram comparing the degree of deformation of a connection member depending on the presence or absence of an intermediate member, according to various embodiments of the disclosure.

According to various embodiments, the connection member 410 may be partially bent at a portion extending to the first printed circuit board 341 after passing by the battery 350. This may be caused by a difference (e.g., a step) between the height of the battery 350 and the height of the first printed circuit board 341.

As shown in FIG. 10A, in a case that the intermediate member 500 is not present, the connection member 410 may be bent due to a difference in height between a portion of the connection member 410 passing by the battery 350 and the first connection part 411 connected to the first printed circuit board 341. As the degree of deformation of the connection member 410 increases, the stress applied to the connection member 410 may increase, which may deteriorate durability or reliability of the connection member 410.

As shown in FIG. 10B, in a case that the intermediate member 500 is present, the height difference between the battery 350 and the first printed circuit board 341 can be reduced by the thickness of the intermediate member 500. Accordingly, the degree of deformation of the connection member 410 is reduced compared to the case of FIG. 10A without the intermediate member 500, so that durability or reliability of the connection member 410 can be improved. In some cases, it is possible to adjust the thickness of the intermediate member 500 such that the top of the first connection part 411 is the same as that of the connection member 410 passing by the battery 350 and thereby the connection member 410 is not deformed.

According to various embodiments of the disclosure, an electronic device (e.g., the electronic device 101 in FIG. 1, the electronic device 200 in FIGS. 2A and 2B, the electronic device 300 in FIG. 3, or the electronic device 400 in FIG. 4A) may include a first printed circuit board (e.g., the first printed circuit board 341 in FIG. 4A); a second printed circuit board (e.g., the second printed circuit board 342 in FIG. 4A) disposed to be spaced apart from the first printed circuit board; a connection member (e.g., the connection member 410 in FIG. 4A) including a first connection part (e.g., the first connection part 411 in FIG. 4A) connected to the first printed circuit board, and a second connection part (e.g., the second connection part 412 in FIG. 4A) connected to the second printed circuit board, and electrically connecting the first printed circuit board and the second printed circuit board; and a first intermediate member (e.g., the first intermediate member 500 in FIG. 6A) including a first connector (e.g., the first connector 510 in FIG. 6A) disposed on a first surface facing the first printed circuit board and electrically connected to the first printed circuit board, and a second connector (e.g., the second connector 520 in FIG. 6A) disposed on a second surface opposite to the first surface and electrically connected to the connection member and the first connector, and the first and second connectors of the first intermediate member may be disposed to be separated from each other in a first direction.

In addition, the electronic device may further include a battery (e.g., the battery 350 in FIG. 4A) disposed between the first printed circuit board and the second printed circuit board, and the connection member may be extended to overlap or partially cover at least part of the battery.

In addition, a separation distance in the first direction between the battery and the first connector may be different from a separation distance in the first direction between the battery and the second connector.

In addition, the first intermediate member may be formed to have a predetermined thickness so as to reduce a step difference between the battery and the first printed circuit board, whereby deformation of the connection member passing by the battery and connected to the second connector of the first intermediate member can be reduced.

In addition, the first connector of the first intermediate member may include a connecting pad (e.g., the connecting pad 511 in FIG. 9) formed to be in contact with a board pad (e.g., the board pad 3412 in FIG. 6A) formed on the first printed circuit board, and the second connector of the first intermediate member may include a socket (e.g., the socket 521 in FIG. 9) formed to allow the first connection part of the connection member to be inserted.

In addition, the connecting pad of the first connector may include a plurality of pads (e.g., the plurality of pads 511A and 511B in FIG. 9) respectively connected to a plurality of pins (e.g., the plurality of pins 521A and 521B in FIG. 9) included in the socket of the second connector, and in the connecting pad, power pads (e.g., the power pads 511B in FIG. 9) disposed on both sides of the first connector may be formed to have a larger width than other pads included in the connecting pad, and be connected to power pins (e.g., the power pins 512B in FIG. 9) for transmitting power among a plurality of pins included in the connection member.

In addition, a plurality of pads included in the connecting pad may include a first pad connected to a first electronic component, a second pad connected to a second electronic component, and a ground pad disposed between the first and second pads and connected to a ground (GND).

In addition, the first and second connectors of the first intermediate member may be electrically connected through a via-hole (e.g., the via-hole 530 in FIG. 7) formed in the first intermediate member.

In addition, the electronic device may further include a second intermediate member (e.g., the second intermediate member 500 in FIG. 6A) including a third connector (e.g., the third connector 510 in FIG. 6A) disposed on a third surface facing the second printed circuit board and electrically connected to the second printed circuit board, and a fourth connector (e.g., the fourth connector 510 in FIG. 6A) disposed on a fourth surface opposite to the third surface and electrically connected to the connection member and the third connector.

In addition, the electronic device may further include a display module (e.g., the display module 800 in FIG. 8), and the connection member may electrically connect the display module and the first printed circuit board.

In addition, the electronic device may further include a cover housing (e.g., the cover housing 401 in FIG. 4A) disposed to cover at least in part the connection member and the second printed circuit board, and a portion of the second connection part of the connection member may be inserted into a hole (e.g., the first hole 402A and the second hole 402B in FIG. 4A) formed in the cover housing.

According to various embodiments of the disclosure, a connection structure of a printed circuit board may include a connection member (e.g., the connection member 410 in FIG. 4A) including a connection part (e.g., the first connection part 411 in FIG. 4A) connected to the printed circuit board (e.g., the first printed circuit 341 in FIG. 4A); and an intermediate member (e.g., the intermediate member 500 in FIG. 6A) including a first connector (e.g., the first connector 510 in FIG. 6A) disposed on a first surface facing the printed circuit board and electrically connected to the printed circuit board, and a second connector (e.g., the second connector 520 in FIG. 6A) disposed on a second surface opposite to the first surface and electrically connected to the connection member, and the first and second connectors of the intermediate member may be disposed to be separated from each other in a first direction.

In addition, the printed circuit board may be disposed adjacent to at least one of electronic components including a battery (e.g., the battery 350 in FIG. 4A).

In addition, a separation distance in the first direction between the electronic component and the first connector may be different from a separation distance in the first direction between the electronic component and the second connector.

In addition, the intermediate member may be formed to have a predetermined thickness so as to reduce a step difference between the electronic component and the printed circuit board, whereby deformation of the connection member passing by the electronic component and connected to the second connector of the intermediate member can be reduced.

In addition, the first connector of the intermediate member may include a connecting pad (e.g., the connecting pad 511 in FIG. 9) formed to be in contact with a board pad (e.g., the board pad 3412 in FIG. 6A) formed on the printed circuit board, and the second connector of the intermediate member may include a socket (e.g., the socket 521 in FIG. 9) formed to allow the first connection part of the connection member to be inserted.

In addition, the connecting pad of the first connector may include a plurality of pads (e.g., the plurality of pads 511A and 511B in FIG. 9) respectively connected to a plurality of pins (e.g., the plurality of pins 521A and 521B in FIG. 9) included in the socket of the second connector, and in the connecting pad, power pads (e.g., the power pads 511B in FIG. 9) disposed on both sides of the first connector may be formed to have a larger width than other pads included in the connecting pad, and be connected to power pins (e.g., the power pins 512B in FIG. 9) for transmitting power among a plurality of pins included in the connection member.

In addition, a plurality of pads included in the connecting pad may include a first pad connected to a first electronic component, a second pad connected to a second electronic component, and a ground pad disposed between the first and second pads and connected to a ground (GND).

In addition, the first and second connectors of the intermediate member may be electrically connected through a via-hole (e.g., the via-hole 530 in FIG. 7) formed in the intermediate member.

In addition, the connection member may electrically connect a display module (e.g., the display module 800 in FIG. 8) and the printed circuit board.

An electronic device, according to an embodiment, may be one of various types of electronic devices. The electronic device may include a portable communication device (e.g., a smart phone), a computer device, a portable multimedia device, a portable medical device, a camera, a wearable device, or a home appliance. However, the electronic device is not limited to any of those described above.

The term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method, according to an embodiment of the disclosure, may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

What is claimed is:

1. An electronic device comprising:
a first printed circuit board;
a second printed circuit board spaced apart from the first printed circuit board;
a connection member electrically connecting the first printed circuit board and the second printed circuit board, the connection member comprising:
a first connection part connected to the first printed circuit board; and
a second connection part connected to the second printed circuit board; and
a first intermediate member comprising:
a first connector provided on a first surface of the first intermediate member facing the first printed circuit board and electrically connected to the first printed circuit board; and
a second connector provided on a second surface of the first intermediate member opposite to the first surface and electrically connected to the connection member and the first connector,
wherein the first connector and the second connector are separated from each other in a first direction.

2. The electronic device of claim 1, further comprising:
a battery provided between the first printed circuit board and the second printed circuit board,
wherein the connection member extends to overlap at least a portion of the battery.

3. The electronic device of claim 2, wherein a first separation distance in the first direction between the battery and the first connector is different from a second separation distance in the first direction between the battery and the second connector.

4. The electronic device of claim 2, wherein the first intermediate member has a thickness configured to reduce a step difference between the battery and the first printed circuit board, and to reduce a deformation of the connection member passing by the battery and connected to the second connector of the first intermediate member.

5. The electronic device of claim 1, wherein the first connector comprises a connecting pad contacting a board pad formed on the first printed circuit board, and
the second connector comprises a socket into which the first connection part of the connection member is inserted.

6. The electronic device of claim 5, wherein the connecting pad comprises a plurality of pads connected to a plurality of first pins included in the socket of the second connector,
the plurality of pads comprise power pads provided on both sides of the first connector and having width larger than widths of remaining pads of the plurality of pads, and
the power pads are connected to power pins for transmitting power among a plurality of second pins included in the connection member.

7. The electronic device of claim 5, wherein the connecting pad comprises:
a first pad connected to a first electronic component of the electronic device;
a second pad connected to a second electronic component of the electronic device; and
a ground pad provided between the first pad and the second pad and connected to a ground.

8. The electronic device of claim 1, wherein the first connector and the second connector are electrically connected through a via-hole formed in the first intermediate member.

9. The electronic device of claim 1, further comprising:
a second intermediate member comprising:
a third connector provided on a third surface of the second intermediate member facing the second printed circuit board and electrically connected to the second printed circuit board; and
a fourth connector provided on a fourth surface of the second intermediate member opposite to the third surface and electrically connected to the connection member and the third connector.

10. The electronic device of claim 1, further comprising:
a display module,
wherein the connection member electrically connects the display module and the first printed circuit board.

11. The electronic device of claim 10, further comprising:
a cover housing covering at least a portion of the connection member and a portion of the second printed circuit board, wherein a portion of the second connection part of the connection member is inserted into a hole formed in the cover housing.

12. A connection structure of a printed circuit board, the connection structure comprising:
   a connection member comprising a connection part connected to the printed circuit board; and
   an intermediate member comprising:
      a first connector provided on a first surface of the intermediate member facing the printed circuit board and electrically connected to the printed circuit board; and
      a second connector provided on a second surface of the intermediate member opposite to the first surface and electrically connected to the connection member and the first connector,
   wherein the first connector and the second connector are separated from each other in a first direction.

13. The connection structure of claim 12, wherein the printed circuit board is adjacent to at least one of electronic components including a battery.

14. The connection structure of claim 13, wherein a first separation distance in the first direction between the at least one of the electronic components and the first connector is different from a second separation distance in the first direction between the at least one of the electronic components and the second connector.

15. The connection structure of claim 13, wherein the intermediate member has a thickness configured to reduce a step difference between the at least one of the electronic components and the printed circuit board, and to reduce a deformation of the connection member adjacent to the at least one of the electronic components and connected to the second connector of the intermediate member.

16. The connection structure of claim 12, wherein the first connector comprises a connecting pad contacting a board pad formed on the printed circuit board, and
   the second connector of the intermediate member comprises a socket configured to allow a first connection part of the connection member to be inserted therein.

17. The connection structure of claim 16, wherein the connecting pad comprises a plurality of pads respectively connected to a plurality of first pins included in the socket of the second connector,
   the plurality of pads comprise power pads provided on both sides of the first connector and having a width larger than widths of remaining pads of the plurality of pads, and
   the power pads of the plurality of pads are connected to power pins for transmitting power among a second plurality of pins included in the connection member.

18. The connection structure of claim 16, wherein the connecting pad comprises:
   a first pad configured to be connected to a first electronic component;
   a second pad configured to be connected to a second electronic component; and
   a ground pad provided between the first pad and the second pad and configured to be connected to a ground.

19. The connection structure of claim 12, wherein the first connector and the second connector of the intermediate member are electrically connected through a via-hole formed in the intermediate member.

20. The connection structure of claim 12, wherein the connection member electrically connects a display module and the printed circuit board.

* * * * *